United States Patent
Esmael et al.

(10) Patent No.: US 10,680,564 B2
(45) Date of Patent: Jun. 9, 2020

(54) BIAS CIRCUIT FOR HIGH EFFICIENCY COMPLIMENTARY METAL OXIDE SEMICONDUCTOR (CMOS) POWER AMPLIFIERS

(71) Applicant: Analog Devices Global Unlimited Company, Hamilton (BM)

(72) Inventors: Mohamed Moussa Ramadan Esmael, Cairo (EG); Mohamed Ahmed Youssef Abdalla, Cairo (EG)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/042,782

(22) Filed: Jul. 23, 2018

(65) Prior Publication Data
US 2020/0028477 A1    Jan. 23, 2020

(51) Int. Cl.
| | |
|---|---|
| *H03F 3/04* | (2006.01) |
| *H03F 3/21* | (2006.01) |
| *H03F 1/32* | (2006.01) |
| *H03F 3/19* | (2006.01) |

(52) U.S. Cl.
CPC .............. *H03F 3/21* (2013.01); *H03F 1/3205* (2013.01); *H03F 3/19* (2013.01); *H03F 2200/21* (2013.01)

(58) Field of Classification Search
CPC ........... H03F 3/04; H03F 3/21; H03F 2200/21
USPC .................................................. 330/285, 296
See application file for complete search history.

(56) References Cited

U.S. PATENT DOCUMENTS

| | | | |
|---|---|---|---|
| 7,005,923 B2 | 2/2006 | Noh et al. | |
| 8,026,767 B2 | 9/2011 | Chen et al. | |
| 8,624,678 B2 | 1/2014 | Scott et al. | |
| 2009/0237156 A1* | 9/2009 | Griffiths | H03F 1/0272 330/86 |
| 2015/0180426 A1 | 6/2015 | Kingsley | |
| 2015/0349715 A1* | 12/2015 | Gerard | H03F 1/56 330/296 |
| 2016/0164469 A1 | 6/2016 | Nobbe et al. | |

FOREIGN PATENT DOCUMENTS

| | | |
|---|---|---|
| CN | 101141114 A | 3/2008 |
| CN | 100488034 C | 5/2009 |

OTHER PUBLICATIONS

Yang, et al., "A 5-GHz Band WLAN SiGe HBT Power Amplifier IC with Novel Adaptive-Linearizing CMOS Bias Circuit," IEICE Trans. Electron., vol. E98-C, No. July 7, 2015.
Yen, et al., "A 0.25-m 20-dBm 2.4-GHz CMOS Power Amplifier With an Integrated Diode Linearizer", IEEE Microwave and Wireless Components Letters, vol. 13, No. 2, Feb. 2003
Shihai He, et al.,"5.25 GHz Linear CMOS Power Amplifier With a Diode-Connected NMOS Bias Circuit", 2012.

* cited by examiner

*Primary Examiner* — Steven J Mottola
(74) *Attorney, Agent, or Firm* — Knobbe, Martens, Olson & Bear, LLP

(57) ABSTRACT

Aspects of this disclosure relate to an adaptive biasing circuit for a power amplifier. The adaptive biasing circuit can include a shunt resistor arrangement and/or a floating gate linearizer arrangement.

22 Claims, 18 Drawing Sheets

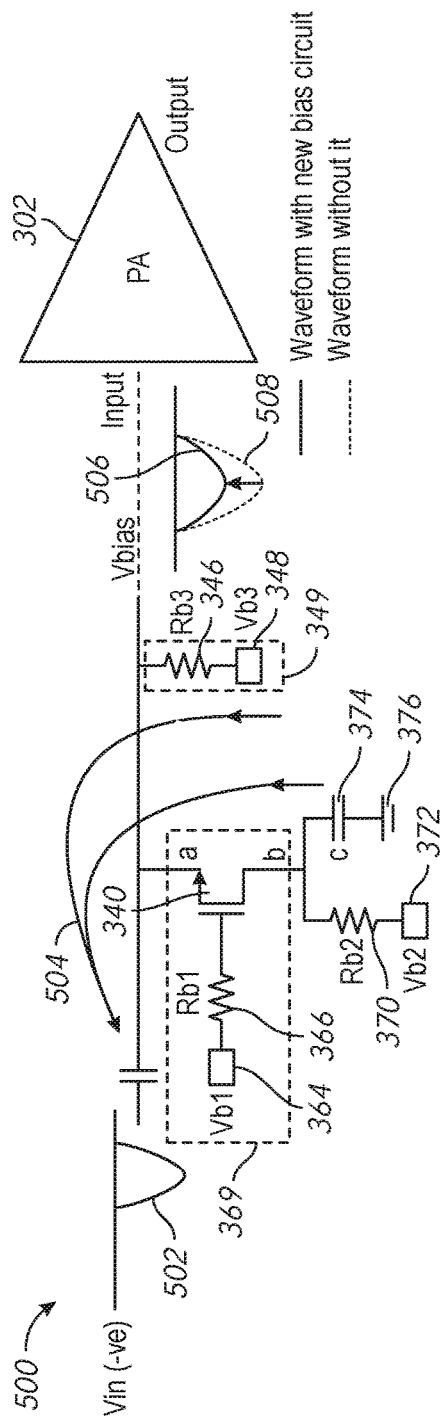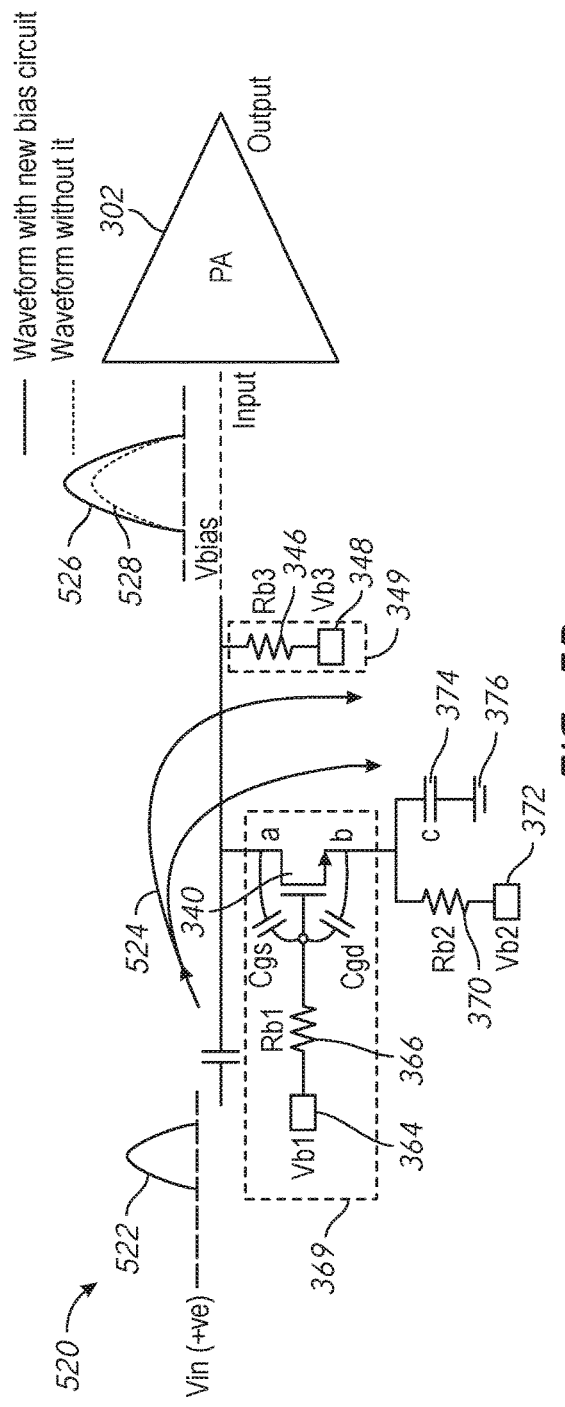
FIG. 5A
FIG. 5B

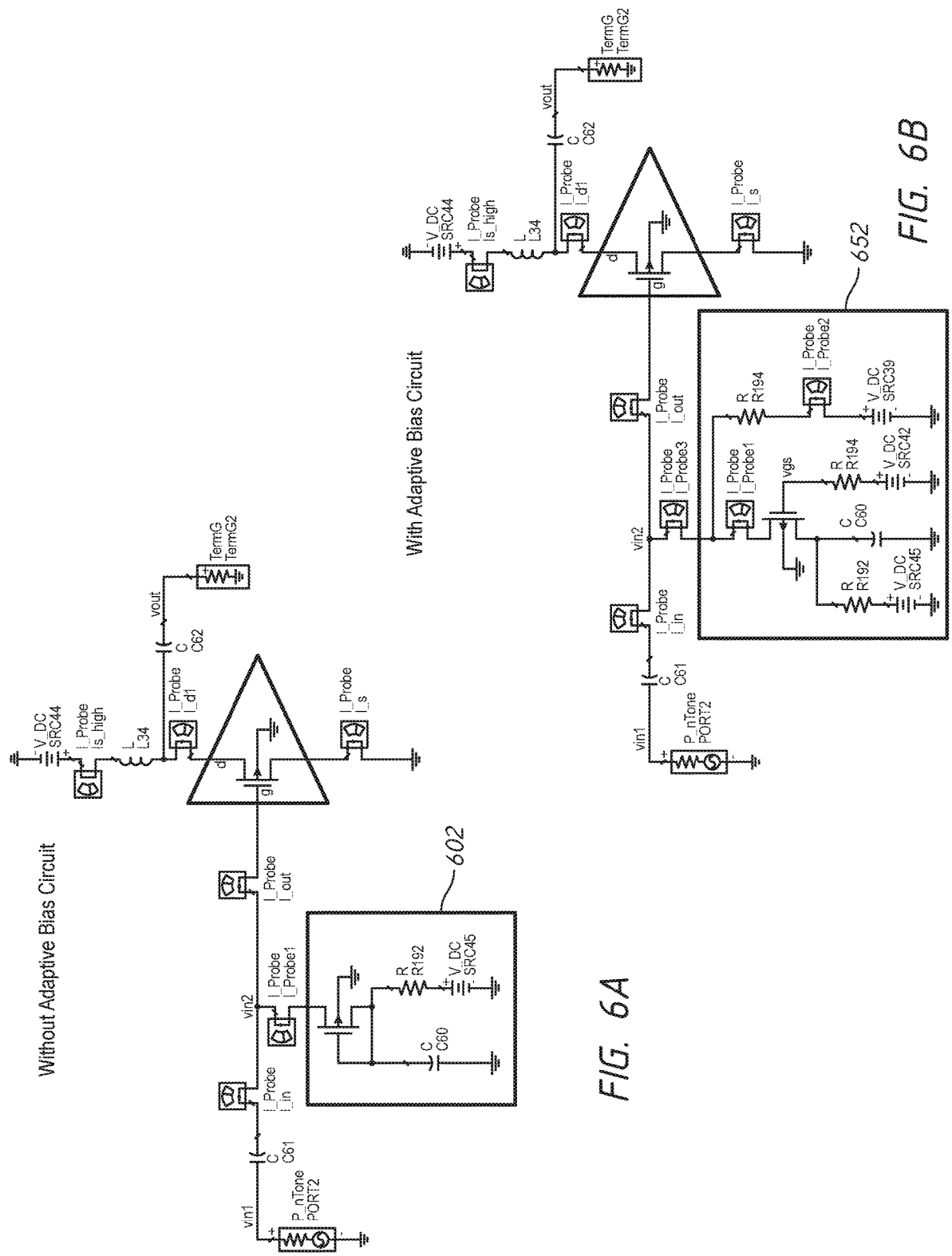

BIAS CIRCUIT FOR HIGH EFFICIENCY COMPLIMENTARY METAL OXIDE SEMICONDUCTOR (CMOS) POWER AMPLIFIERS

FIELD OF DISCLOSURE

The present disclosure relates to electronic devices, in particular, to bias circuits for power amplifiers.

BACKGROUND

There has been a proliferation of wireless technology, fueled in part by advances in transistor scaling, digital signal processing, and transceiver architectures that are amenable to silicon integration. Wireless transceivers have become ubiquitous, integrating into cellular phones, laptops, gaming consoles, global positioning systems, medical devices, satellite communications, radio and TV transmitters, RF-power heating, and a plethora of consumer electronics. Much of this success can be attributed to the advancement in semiconductor technology, particularly CMOS technology.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

In certain embodiments, a bias circuit is provided that discloses a field-effect transistor (FET); a linearizer arrangement configured to float a gate terminal of the FET to generate a bias signal with quadratic ramping; and a resistor arrangement electrically connected in parallel with the linearizer arrangement, where the resistor arrangement is configured to add a linear term to the bias circuit ramping, and where the linearizer arrangement and the resistor arrangement are configured to provide the bias signal at an input of the power amplifier to enhance efficiency of the power amplifier.

In some embodiments, the resistor arrangement is a shunt resistor arrangement that comprises a first resistor, where a first end of the first resistor is electrically connected to a first node, the first node is electrically connected to an input of the power amplifier.

In some embodiments, a second end of the first resistor is electrically connected to a first voltage source.

In some embodiments, the first node is further electrically connected to an alternating power source.

In some embodiments, the bias circuit increases a magnitude of the input bias for the power amplifier during a negative half cycle of the alternating power source and where the bias circuit increases or maintains the same magnitude of the input bias for the power amplifier during a positive half cycle of the alternating power source.

In some embodiments, the linearizer arrangement is a floating gate linearizer arrangement that comprises the FET, where the FET includes a first terminal, a second terminal, and the gate terminal. The gate terminal is electrically connected to a first end of a second resistor, and the first node is further electrically connected to the first terminal of the FET.

In some embodiments, a second node is electrically connected to the second terminal of the FET, a first end of a capacitor, and a first end of a third resistor.

In some embodiments, a second end of the first resistor is electrically connected to a first voltage source, a second voltage source is electrically connected to the second end of the second resistor, a third voltage source is electrically connected to a second end of a third resistor, and the first voltage source, the second voltage source, and the third voltage source are different.

In some embodiments, a value of the first voltage source, the second voltage source, and the third voltage source are based on a selected class of power amplifiers.

In some embodiments, a value of the at least one of the first resistor, the second resistor, the third resistor, the capacitor, or the FET is based on a selected class of power amplifiers.

In some embodiments, a second end of the first resistor is electrically connected to a first voltage source, a second voltage source is electrically connected to the second end of the second resistor, a third voltage source is electrically connected to a second end of a third resistor, and at least two of the first voltage source, the second voltage source, and the third voltage source are connected.

In some embodiments, a second end of the capacitor is electrically connected to ground.

In some embodiments, the power amplifier is a CMOS power amplifier.

In certain embodiments, a bias circuit for a power amplifier to control bias ramping for a power amplifier is provided that discloses a linearizer arrangement electrically connected to the input of the power amplifier in parallel with a MOSFET, where the linearizer arrangement is configured to enhance linearity of bias ramping for the power amplifier.

In some embodiments, the linearizer arrangement is a floating gate linearizer that comprises a first FET, wherein the first FET includes a first terminal, a second terminal, and a gate terminal, where the gate terminal is electrically connected to a first end of a second resistor, and a first node is electrically connected to an input of the power amplifier, the first terminal of the first FET, and an alternating power source.

In some embodiments, during a negative half cycle of the alternating power source, the current propagates from the second terminal to the first terminal of the first FET, and during a positive half cycle of the alternating power source, the current propagates from the first terminal to the second terminal of the first FET.

In some embodiments, the bias circuit decreases a magnitude of the input for the power amplifier during a negative half cycle of an alternating power source and wherein the bias circuit increases a magnitude of the input for the power amplifier during a positive half cycle of the alternating power source.

In certain embodiments, a bias circuit for a power amplifier to control bias ramping for a power amplifier is provided that discloses a resistor arrangement that is configured to enhance linearity of bias ramping for the power amplifier.

In some embodiments, the resistor arrangement is a shunt resistor arrangement that comprises a first resistor, where a first end of the first resistor is electrically connected to a first node, and the first node is electrically connected to an input of the power amplifier.

In some embodiments, the linearizer arrangement further comprises a second FET connected in parallel to the first FET.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 5A is a diagram of the CMOS power amplifier with the shunt resistor arrangement and the floating gate linearizer arrangement during a negative voltage cycle, according to an embodiment.

FIG. 5B is a diagram of the CMOS power amplifier with the shunt resistor arrangement and the floating gate linearizer arrangement during a positive voltage cycle, according to an embodiment.

FIG. 6A is a simulation test bench for a CMOS power amplifier without the adaptive bias circuit, according to an embodiment.

FIG. 6B is a simulation test bench for a CMOS power amplifier with the adaptive bias circuit, according to an embodiment.

DETAILED DESCRIPTION

Overview

Figure 1A:
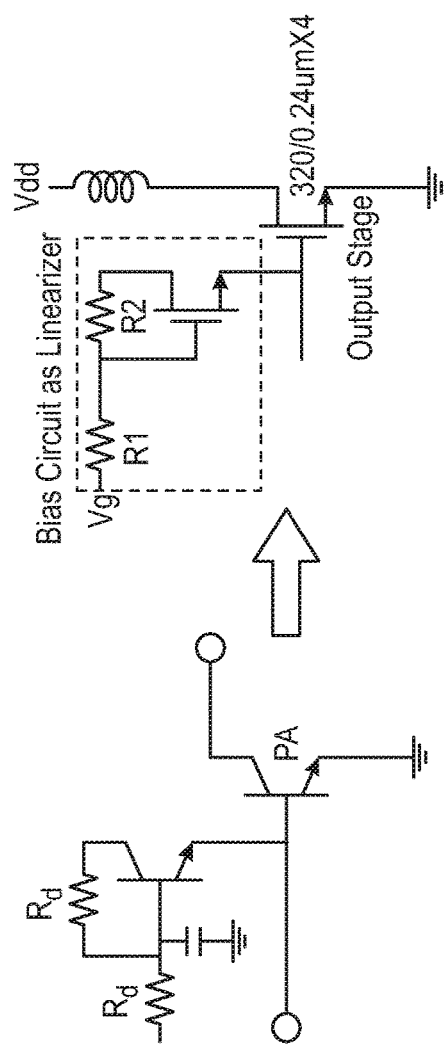
FIG. 1A is a schematic diagram of a conventional bipolar based diode linearizer circuit and its one-to-one CMOS implementation, according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

In today's wireless communications, mobile networks need high data rates and low power consumption. Architectures with power amplifiers are popular for such applications. However, there is a tradeoff between efficiency and linearity of power amplifiers. Improved efficiency and linearity of power amplifiers can reduce power consumption and can require fewer devices to deliver a specific RF output power, thus requiring a smaller overall amplifier footprint. In power amplifiers, reducing power consumption using a low cost solution is important.

Systems, apparatuses, and methods herein describe a bias circuit that increase overall efficiency, output power, and linearity of power amplifiers with reliable supply voltage levels using a controllable bias network. The bias circuit can be applied to CMOS power amplifiers, which can have many benefits, such as low cost, high integration, versatile calibration, and the like. For example, the bias circuit described can be used on a 28 nm CMOS power amplifiers for 5G applications. Such 5G applications can be targeted to wide frequency bands, such as between approximately 24-44 GHz.

Although amplification of certain CMOS power amplifiers can be high, the efficiency of the conversion from the DC power supply to an AC power output is typically low. Although the power amplifier can be driven to its non-linear region to improve efficiency, this typically results in distortion. Thus, there is need for improved efficiency and higher output power of CMOS power amplifiers while maintaining high linearity. Yet another need is for improved power consumption for the power amplifiers.

Power Amplifiers and Linearizers/Bias Circuits

Figure 1B:
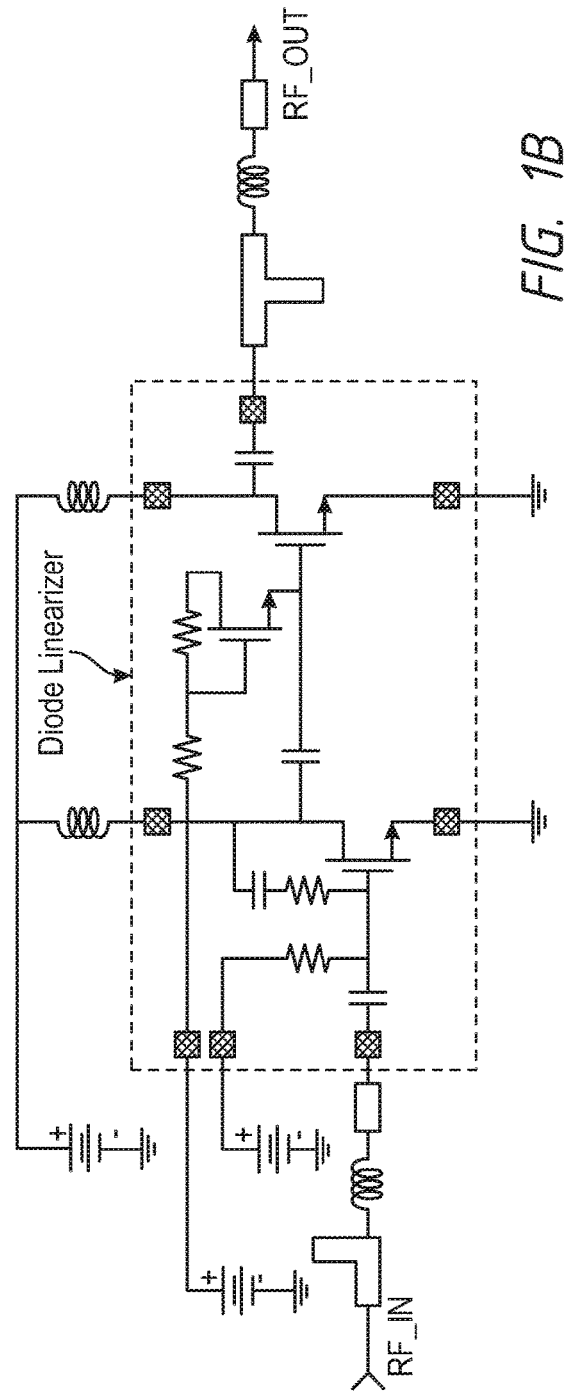
FIG. 1B is a schematic diagram of a 2-stage CMOS power amplifier where stage 1 does not employ linearization and stage 2 employs the conventional CMOS diode connected linearizer circuit, according to an embodiment.

FIGS. 1A and 1B are schematic diagrams of a power amplifier with an integrated diode linearizer. FIG. 1A is a schematic diagram of a conventional bipolar based diode linearizer circuit and its one-to-one CMOS implementation.

FIG. 1B is a schematic diagram of a 2-stage CMOS power amplifier where stage 1 does not employ linearization and stage 2 employs the conventional CMOS diode connected linearizer circuit. The power amplifiers of FIGS. 1A and 1B use an integrated diode by connecting the drain and gate of an NMOS transistor to act as a diode.

Figure 2B:
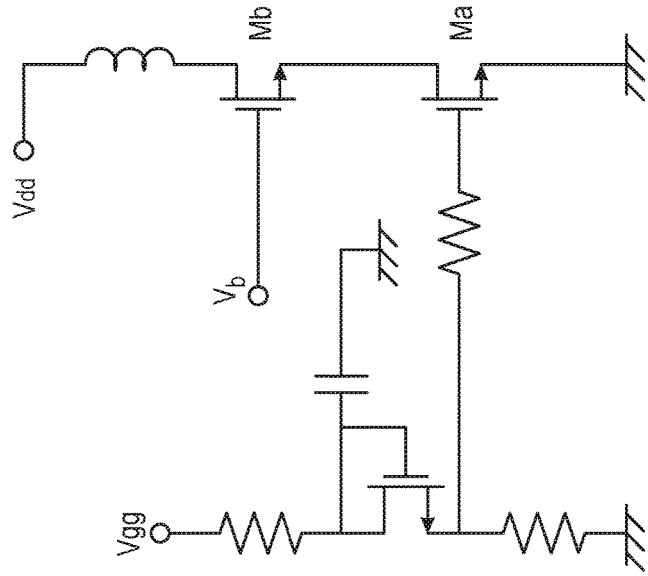
FIG. 2B is a schematic diagram of a CMOS power amplifier with a diode linearizing circuit, according to an embodiment.
Figure 2C:
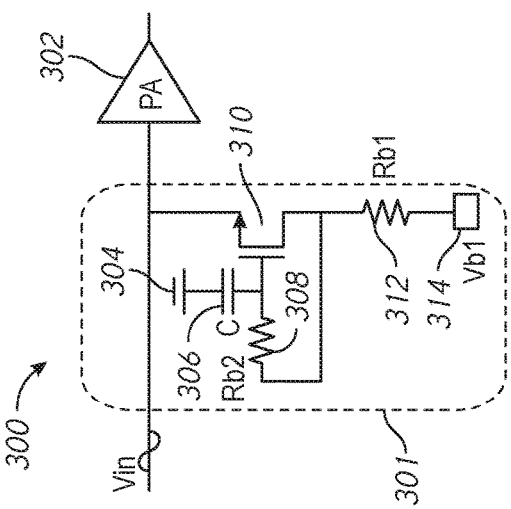
FIG. 2C is a schematic diagram of a CMOS power amplifier with a bias circuit, according to an embodiment.
Figure 2A:
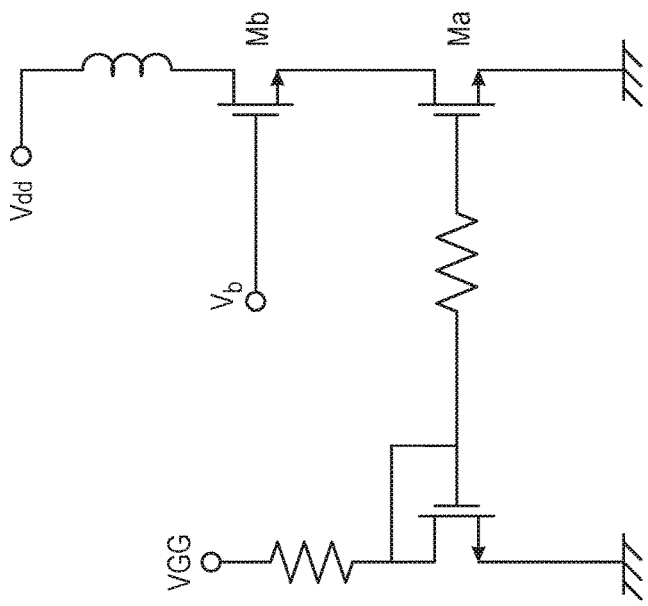
FIG. 2A is a CMOS power amplifier with a class-A biasing circuit (no linearization), according to an embodiment.

FIGS. 2A and 2B are schematic diagrams of a CMOS power amplifier.

FIG. 2A is a CMOS power amplifier with a class-A biasing circuit (no linearization).

FIG. 2B is a schematic diagram of a CMOS power amplifier with a diode linearizing circuit, for example with an extra resistor to bias the CMOS diode connected to the linearizer circuit. The diode-connected NMOS transistor acts as a linearizer.

FIG. 2C is a schematic diagram 300 of a CMOS power amplifier 302 with a bias circuit 301. The bias circuit 301 can include a CMOS diode connected linearizer with an RC feedback circuit. The bias circuit can include a ground 304, a capacitor 306, a resistor Rb2 308, a MOSFET 310, a resistor Rb1 312, and a voltage source 314.

The bias circuit 301 can be connected to an alternating voltage source Vin and an input of the power amplifier 302 via a source of a MOSFET 310. The gate of the MOSFET 310 can be connected to a resistor Rb2 308 and a capacitor C 306. The other end of the capacitor C 306 can be connected to a ground 304. The other end of the resistor Rb2 308 can be connected to the drain of the MOSFET 310 and a resistor Rb1 312. The other end of the resistor Rb1 312 can be connected to a voltage source Vb1 314.

The bias circuit 301 can increase the bias point at the input of the power amplifier 302 if the input power increases. However, for the bias circuit 301, the current is proportional or approximately proportional to the quadratic of the voltage input signal, thus leading to uncontrolled ramping. For example, excessive current ramping that doesn't necessarily lead to increased output power results in lowered power amplifier efficiency.

Techniques described above create uncontrolled ramping, which affects the efficiency of the power amplifier 302. The uncontrolled ramping further degrades AM-AM distortion and AM-PM distortion, which is an important parameter for 5G and beamforming applications. Furthermore, uncontrolled ramping can result in overdrive conditions resulting in a highly saturated amplifier, which can affect the temperature of the device and/or cause device failure.

Overview of the New Adaptive Bias Circuit for Power Amplifiers

Aspects of this disclosure relate to technical solutions that can alleviate the uncontrolled ramping of the power amplifier. Thus, aspects of this disclosure improve efficiency, linearity, AM-AM distortion, and AM-PM distortion via a bias circuit that adjusts the bias point according to the output power in a controlled manner. Thus, if the system requires high output power, the bias point can be increased by increasing the bias current. If the system requires low output power, the bias current can be reduced in order to achieve high efficiency and low power consumption. The bias circuit can achieve such performance by controlling the bias ramping of the power amplifier. In some embodiments, such control can be achieved without the use of a controller, which can limit the maximum efficiency.

Figures 3A, 3B:
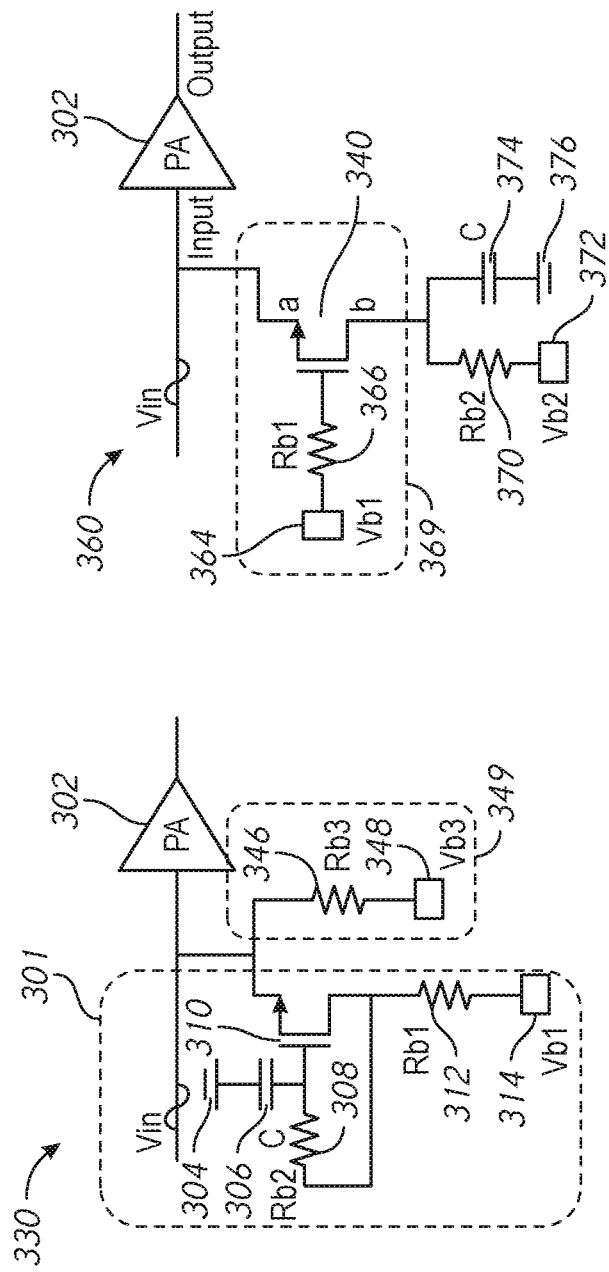
FIG. 3A is a schematic diagram of a CMOS power amplifier with a shunt resistor arrangement and a bias circuit, according to an embodiment.
FIG. 3B is a schematic diagram of a CMOS power amplifier with a floating gate linearizer arrangement, according to an embodiment.

FIG. 3A is a schematic diagram 330 of a CMOS power amplifier 302 with a shunt resistor arrangement 349 and a bias circuit 301 according to some embodiments. The bias circuit 301 can include a ground 304, a capacitor 306, a resistor Rb2 308, a MOSFET 310, a resistor Rb1 312, and a voltage source 314 as illustrated in FIG. 2C.

The shunt resistor arrangement 349 can include a resistor Rb3 346 and a voltage source Vb3 348. A first end of the resistor Rb3 346 can be electrically connected to the input of the power amplifier 302 and one of a source or drain of the MOSFET 310. A second end of the resistor Rb3 346 can be electrically connected to the voltage source Vb3 348.

In some embodiments, the shunt resistor arrangement 349 adds a linear element to the bias circuit of FIG. 2C. Thus, the shunt resistor arrangement 349 adds a linear ramping term to the quadratic term of the MOSFET 310, improving the bias ramping of the power amplifier 302. The bias point can become a function of the device and the resistor, creating a non-linear bias circuit and improving the efficiency of the power amplifier.

FIG. 3B is a schematic diagram 360 of a CMOS power amplifier 302 with a floating gate linearizer arrangement 369. The schematic diagram 360 as illustrated in FIG. 3B also includes a resistor Rb2 370, a voltage source Vb2 372, a capacitor 374, and a ground 376. The floating gate linearizer arrangement 369 can include a MOSFET 340, a resistor Rb1 366, and a voltage source Vb1 364.

The MOSFET 340 can include a first terminal, a second terminal, and a gate. The gate can be connected to a first end of a resistor Rb1 366. The second end of the resistor Rb1 366 can be connected to a voltage source Vb1 364. The first terminal of the MOSFET 340 can be connected to the alternating voltage source and the input of the power amplifier 302. The second terminal of the MOSFET 340 can be connected to a first end of a resistor Rb2 370 and a first end of a capacitor 374. The second end of the resistor Rb2 370 can be connected to a voltage source Vb2 372. The second end of the capacitor 374 can be connected to ground 376. The floating gate linearizer arrangement 369 allows for gate swing, and floating the gate in the linearizer circuit reduces Vgs on the device which reduces the bias ramping and improves the efficiency of the power amplifier.

Figure 3C:
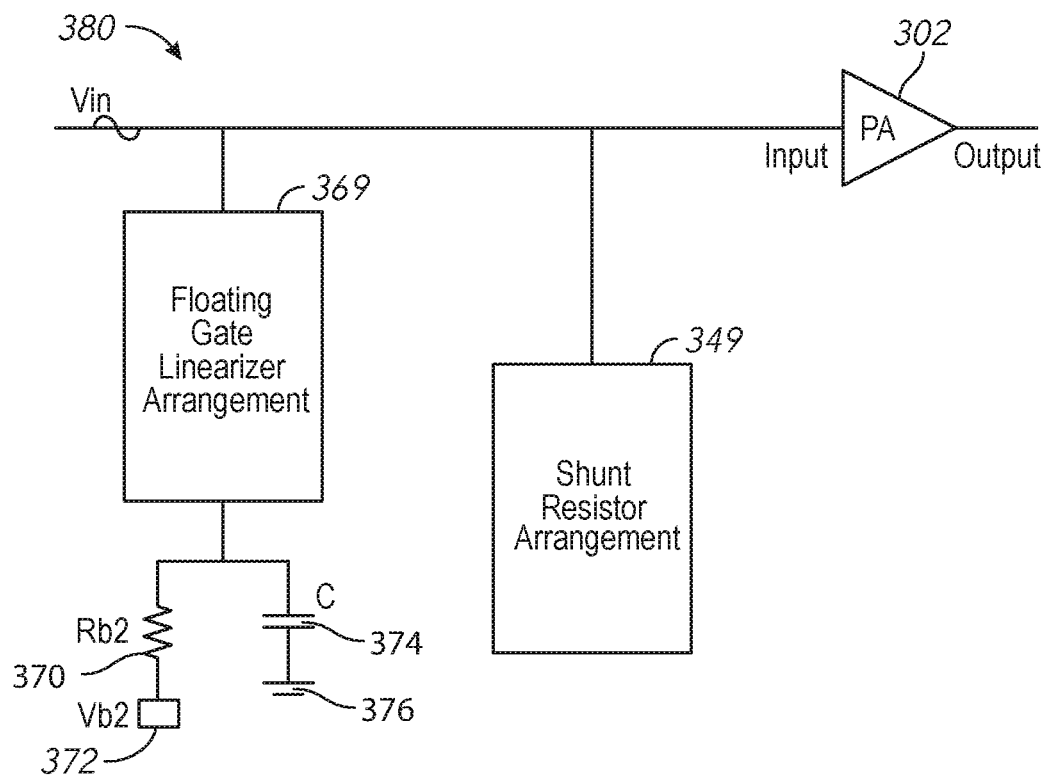
FIG. 3C is a block diagram of a CMOS power amplifier with the shunt resistor arrangement and the floating gate linearizer arrangement, according to an embodiment.

FIG. 3C is a block diagram 380 of a CMOS power amplifier 302 with the shunt resistor arrangement 349 and the floating gate linearizer arrangement 369 according to some embodiments. The block diagram 380 as illustrated in FIG. 3C also includes a resistor Rb2 370, a voltage source Vb2 372, a capacitor 374, and a ground 376. The floating gate linearizer arrangement 369 can include the floating gate linearizer arrangement as illustrated in FIG. 3B. The shunt resistor arrangement 349 can include the shunt resistor arrangement as illustrated in FIG. 3A.

The shunt resistor arrangement 349 can be disposed in parallel with the floating gate linearizer arrangement 369. A first end of the shunt resistor arrangement 349 and a first end of the floating gate linearizer arrangement 369 can be electrically connected to the input of the power amplifier 302 and an alternating voltage source. A second end of the floating gate linearizer arrangement 369 can be connected to a first end of a resistor Rb2 370 and a first end of a capacitor C 374. A second end of the resistor Rb2 370 can be electrically connected to a voltage source Vb2 372. A second end of the capacitor C 374 can be electrically connected to ground 376.

Figure 3D:
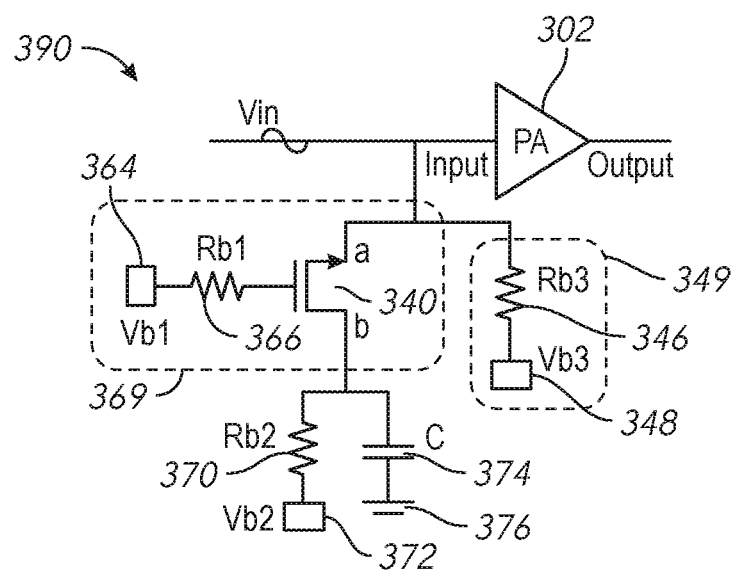
FIG. 3D is a schematic diagram of a floating gate linearizer arrangement, a CMOS power amplifier, and a shunt resistor arrangement, according to an embodiment.

FIG. 3D is a schematic diagram 390 of a floating gate linearizer arrangement 369, a CMOS power amplifier 302, and a shunt resistor arrangement 349. The schematic diagram 390 of FIG. 3D as illustrated further includes a resistor Rb2 370, a voltage source Vb2 372, a capacitor 374, and a ground 376.

The shunt resistor arrangement 349 can include a resistor Rb3 346 and a voltage source Vb3 348 as illustrated in FIG. 3A. The floating gate linearizer arrangement 369 can include a MOSFET 340, a resistor Rb1 366, and a voltage source Vb1 364 as illustrated in FIG. 3B. The shunt resistor arrangement 349 as illustrated in FIG. 3A can be combined with the floating gate linearizer arrangement 369 as illustrated in FIG. 3B.

The floating gate linearizer arrangement 369 and the shunt resistor arrangement 349 as illustrated in FIGS. 3C and 3D adds more degrees of freedom to control biasing for different operating modes using three voltage sources Vb1 364, Vb2 372, and Vb3 348. The voltage sources Vb1 364, Vb2 372, and Vb3 348 can be bias voltages, can be generated using current sources, and can be determined based on the type of bias circuit desired. In some embodiments, the two or more voltage sources Vb1 364, Vb2 372, and Vb3 348 can be connected to each other (such as Vb2 372 and Vb3 348 connected to each other). The floating gate linearizer arrangement 369 and the shunt resistor arrangement 349 as illustrated in FIGS. 3C and 3D further adds more degrees of freedom with the resistors Rb1 366, Rb2 370, and Rb3 346, the capacitor C 374, and the MOSFET 368.

The degrees of freedom can be altered to change the class of the power amplifier. For example, changing the Vb3 348 voltage value from a low to a high value can shift the power amplifier from a class B to a Class A power amplifier. Advantageously, the power amplifier can be changed from a more linear Class A amplifier to a more efficient class B amplifier based on the desired application. The other embodiments describe a single voltage source Vb1 314 that can limit operation of the power amplifier.

Table 1 describes an illustrative example of how certain parameters can be determined for the floating gate linearizer arrangement 369 and the shunt resistor arrangement 349 as illustrated in FIGS. 3C and 3D:

TABLE 1

Example Parameters for Bias Circuit

| | |
|---|---|
| Vb3 & Vb2 & Vb1 | Based on these voltages, the biasing class can be adjusted (such as setting Vb3 = Vth and Vb1 = Vb2 provides class B operation) These voltages can track process and temperature for minimum variations (such as Vb3) Simple bias: Vb3 from diode connected to the MOSFET, Vb1 & Vb2 from same source |
| MOSFET size | Based on frequency and optimized for linearity & power output |
| Rb1 | Determines swing and used to float the gate of MOSFET, and how strong the quadratic ramping term |
| Rb2 | Bias resistor, to maintain Vbs of MOSFET |
| C | Typically AC short capacitor, but its value may affect linearity |
| Rb3 | Determines linear ramping term |

Figure 3E:
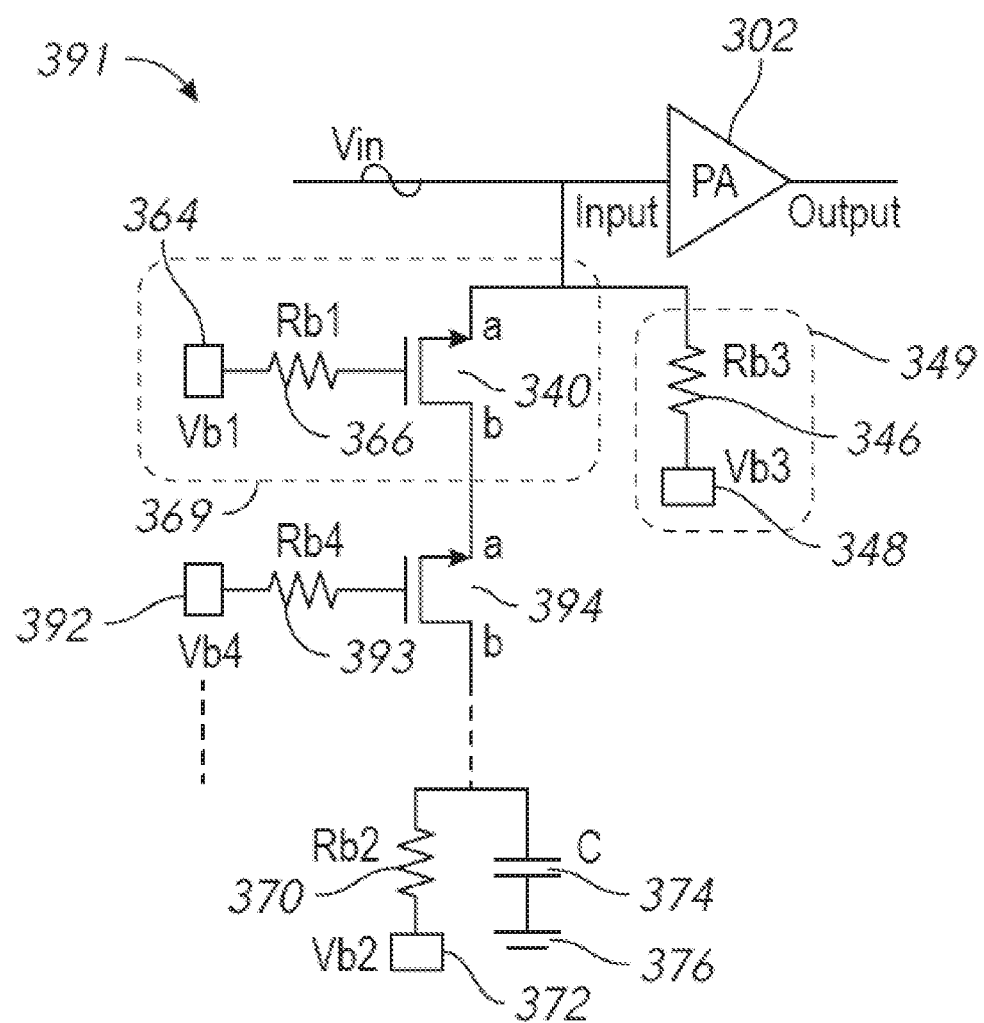
FIG. 3E is a schematic diagram of a CMOS power amplifier with the shunt resistor arrangement and the floating gate linearizer arrangement for high power applications, according to an embodiment.

FIG. 3E is a schematic diagram 391 of a CMOS power amplifier 302 with the shunt resistor arrangement 349 and the floating gate linearizer arrangement 369 for high power applications according to some embodiments. The schematic diagram 391 as illustrated in FIG. 3E includes similar elements as the floating gate linearizer arrangement 369 and the shunt resistor arrangement 349 in FIG. 3D with the addition of a second MOSFET 394, a second voltage source Vb4 392, and a resistor Rb4 393. The floating gate linearizer can be configured with one or more stacks of MOSFETs, such as 340 and 394, in series in order to further divide the swing on the MOSFETS.

Enhanced Linearization in Voltage Bias of New Adaptive Bias Circuit

Figure 4:
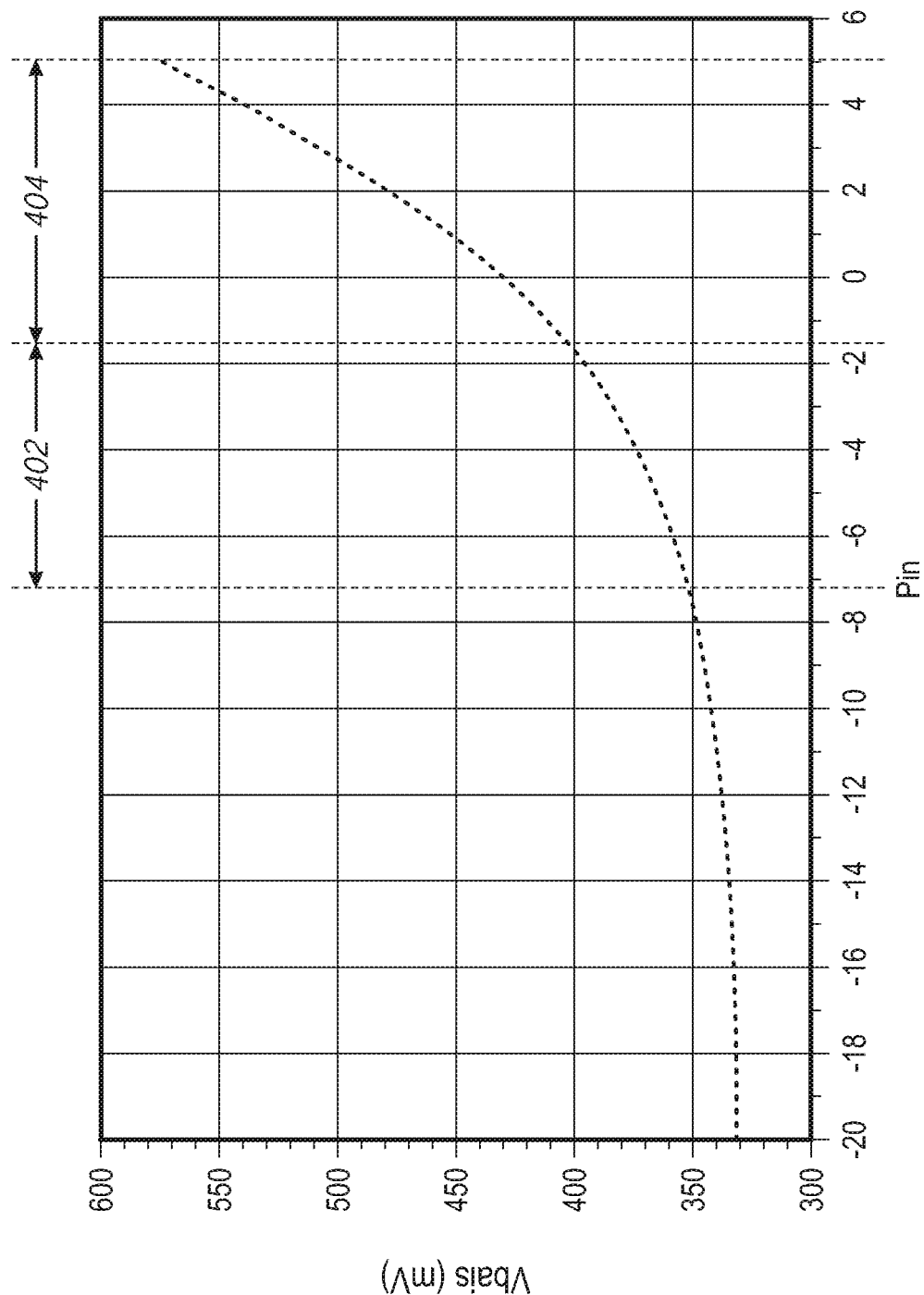
FIG. 4 is a graph of the voltage bias of the CMOS power amplifier with the shunt resistor arrangement and the floating gate linearizer arrangement, according to an embodiment.

FIG. 4 is a graph of the voltage bias of the CMOS power amplifier with the shunt resistor arrangement and the floating gate linearizer arrangement according to some embodiments. The graph illustrates the change in voltage bias across input power. Generally, with increased input power, the voltage bias also increases. The CMOS power amplifier with the shunt resistor arrangement and the floating gate linearizer arrangement allows for increase of output power with increased input power with enhanced efficiency.

The shunt resistor arrangement and the floating gate linearizer arrangement as illustrated in FIG. 3C allows for enhanced control ramping. The shunt resistor arrangement and the floating gate linearizer can improve linearization of the MOSFET in the region 402 of FIG. 4 using the resistor Rb3 as illustrated in FIG. 3D at back off power. At higher power, the quadratic element will have more effect such as in region 404 of FIG. 4. The floating gate linearizer arrangement can improve linearization of the MOSFET in the region 404.

The voltage bias can be expressed by:

$$V\text{bias}=\text{Quadratic Term}+\text{Linear Term}$$

where the quadratic term is from the MOSFET where the floating gate linearizer arrangement can allow swing on the gate of the MOSFET, reducing Vgs and ramping. The floating gate linearizer arrangement allows the voltage on the gate due to voltage division to swing on the MOSFET capacitors Cgs and Cgd, as illustrated in FIG. 5B.

The saturation region for the MOSFET can be determined by:

$$i\text{mos}=\tfrac{1}{2}k(V_{gs}-V_{th})^2$$

where $C_{gs}-C_{gd}=C_n$. In some embodiments, the MOSFET can include depletion mode MOSFET, an enhancement mode MOSFET, a dual-gate MOSFET, a metal-insulator-semiconductor FET (MISFET), a power MOSFET, a double-diffused metal-oxide-semiconductor (DMOS), a radiation-hardened-by-design (RHBD), a p-channel MOSFET (PMOS), a tri-gate MOSFET (FINFET), and/or the like. The gain-source voltage can be expressed by:

$$V_{gs} = V_{in} * \frac{C_n}{2C_n} = \frac{V_{in}}{2}$$

Thus, the floating gate effect can be expressed by:

$$imos = \frac{k}{2}\left(\frac{V_{in}}{2} - V_{th}\right)^2$$

The linear term can be added from the shunt resistor arrangement that allows the addition of a linear ramping term to the quadratic term of the MOSFET which can enhance control of the ramping. The linear term from the shunt resistor can be expressed by:

$$\text{Linear Term} = \frac{V_{b3} - V_{in,average}}{R_{b3}}$$

New Adaptive Bias Circuit Performance During Positive and Negative Voltage Cycles FIG. 5A is a diagram 500 of the CMOS power amplifier with the shunt resistor arrangement and the floating gate linearizer arrangement during a negative voltage cycle. FIG. 5B is a diagram 520 of the CMOS power amplifier with the shunt resistor arrangement and the floating gate linearizer arrangement during a positive voltage cycle. The diagrams 500, 520 of the CMOS power amplifier with the shunt resistor arrangement and the floating gate linearizer arrangement during a negative voltage cycle and a positive voltage cycle can include a shunt resistor arrangement 349 and a floating gate linearizer arrangement 369 as illustrated in FIG. 3D.

In FIG. 5A, a negative voltage cycle 502 is input. Without the shunt resistor arrangement and the floating gate linearizer arrangement and using a constant bias instead, the input of the power amplifier 302 can be the voltage wave 508. With the shunt resistor arrangement 349 and the floating gate linearizer arrangement 369, the current 504 can flow through the shunt resistor arrangement 349 and the floating gate linearizer arrangement 369. Accordingly, terminal b of the MOSFET becomes the drain and terminal a of the MOSFET becomes the source, and the voltage bias will be supported from voltage source Vb3 to the input. Thus, the input of the power amplifier 302 can be the voltage wave 506. The magnitude of the voltage during the negative voltage cycle will increase, which can lead to higher average power and increased efficiency.

In FIG. 5B, a positive voltage cycle 522 is input. Without the shunt resistor arrangement and the floating gate linearizer arrangement and using a constant bias instead, the input of the power amplifier 302 can be the voltage wave 528. With the shunt resistor arrangement 349 and the floating gate linearizer arrangement 369, the current 524 can flow through the shunt resistor arrangement 349 and the floating gate linearizer arrangement 369. Accordingly, terminal b of the MOSFET becomes the source and terminal a of the MOSFET becomes the drain, and the voltage bias will be supported from the input to the voltage source Vb3. Thus, the input of the power amplifier 322 can be the voltage wave 526. The magnitude of the voltage during the positive voltage cycle will increase, which can also lead to higher average power and increased efficiency. Advantageously, the power amplifier and the bias circuit can require a smaller heat sink due to the increased efficiency.

Simulation of New Adaptive Bias Circuit

FIG. 6A is a simulation test bench for a CMOS power amplifier without the adaptive bias circuit. The circuit 602 as illustrated in FIG. 6A does not include the adaptive bias circuit.

FIG. 6B is a simulation test bench for a CMOS power amplifier with the adaptive bias circuit. The adaptive bias circuit 652 can include the shunt resistor arrangement 349 and the floating gate linearizer arrangement 369 as illustrated in FIG. 3D.

Figure 7A:
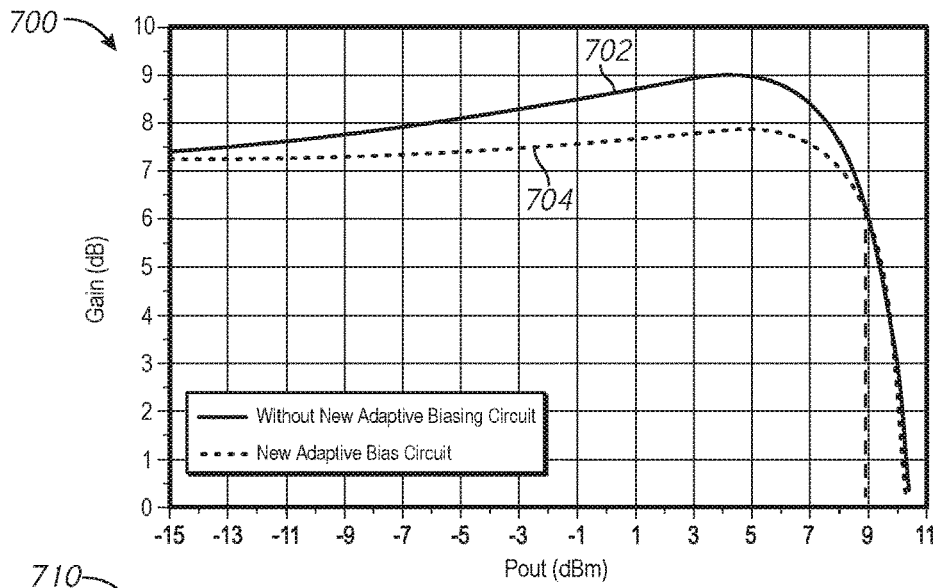
FIG. 7A is graph of gain versus output power, according to an embodiment.

FIG. 7A is graph 700 of gain versus output power. Trace 704 illustrates the gain versus output power of the simulated CMOS power amplifier with the adaptive bias circuit as illustrated in FIG. 6A. Trace 702 illustrates the gain versus output power of the simulated CMOS power amplifier without the adaptive bias circuit as illustrated in FIG. 6B. The simulation of the CMOS power amplifier with and without the adaptive bias circuit illustrates an improvement of more constant gain across the power output with reduced slope and a smaller peak gain value.

Figure 7B:
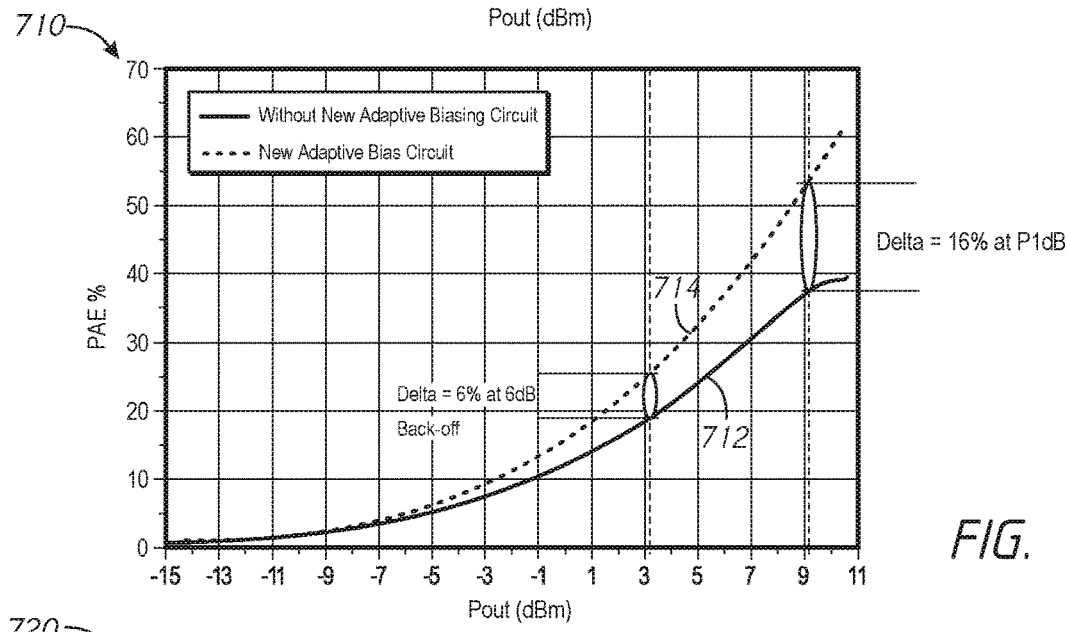
FIG. 7B is graph of power amplifier efficiency versus output power, according to an embodiment.

FIG. 7B is graph 710 of power amplifier efficiency versus output power. Trace 714 illustrates the power amplifier efficiency versus output power of the simulated CMOS power amplifier with the adaptive bias circuit as illustrated in FIG. 6A. Trace 712 illustrates the power amplifier efficiency versus output power of the simulated CMOS power amplifier without the adaptive bias circuit as illustrated in FIG. 6B. The simulation of the CMOS power amplifier with and without the adaptive bias circuit illustrates an improvement of 16% at the P1 dB point, and 6% at the 6 dB back-off point.

Figure 7C:
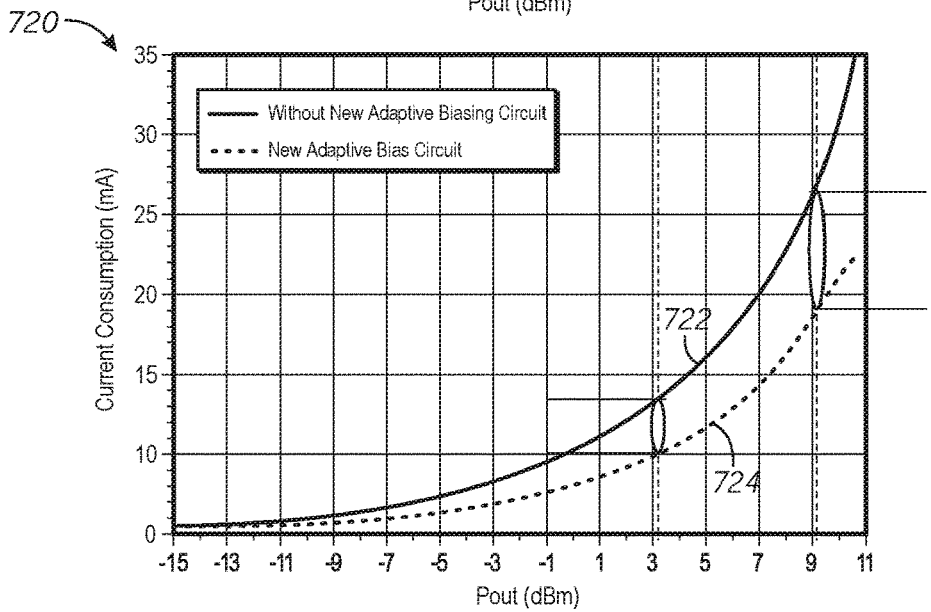
FIG. 7C is graph of current consumption versus output power, according to an embodiment.

FIG. 7C is graph 720 of current consumption versus output power. Trace 724 illustrates the current consumption versus output power of the simulated CMOS power amplifier with the adaptive bias circuit as illustrated in FIG. 6A. Trace 722 illustrates the current consumption versus output power of the simulated CMOS power amplifier without the adaptive bias circuit as illustrated in FIG. 6B. The simulation of the CMOS power amplifier with and without the adaptive bias circuit illustrates that the slope of the ramping is reduced, has improved linearity, and enhanced controlled ramping.

Figure 8A:
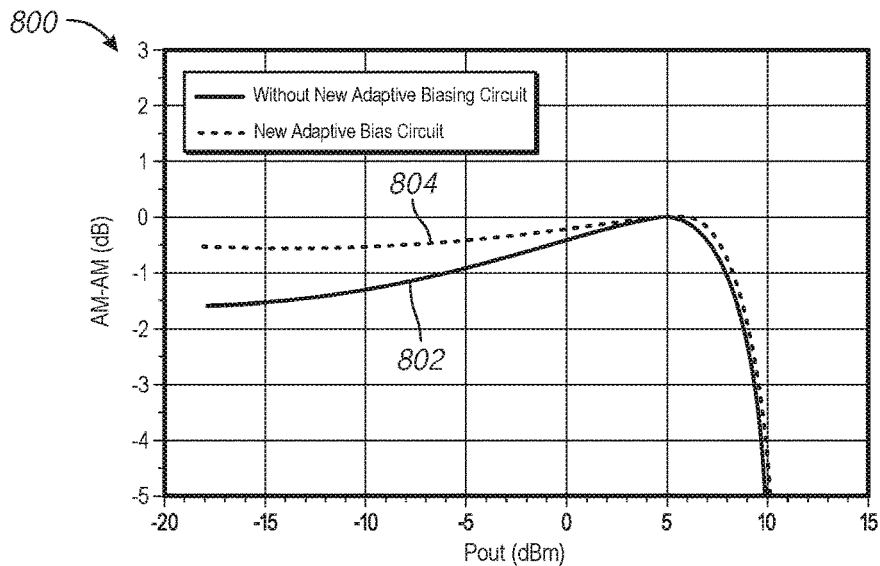
FIG. 8A is graph of AM-AM distortion versus output power, according to an embodiment.

FIG. 8A is graph 800 of AM-AM distortion versus output power. Trace 804 illustrates the distortion versus output power of the simulated CMOS power amplifier with the adaptive bias circuit as illustrated in FIG. 6A. Trace 802 illustrates the distortion versus output power of the simulated CMOS power amplifier without the adaptive bias circuit as illustrated in FIG. 6B.

Figure 8B:
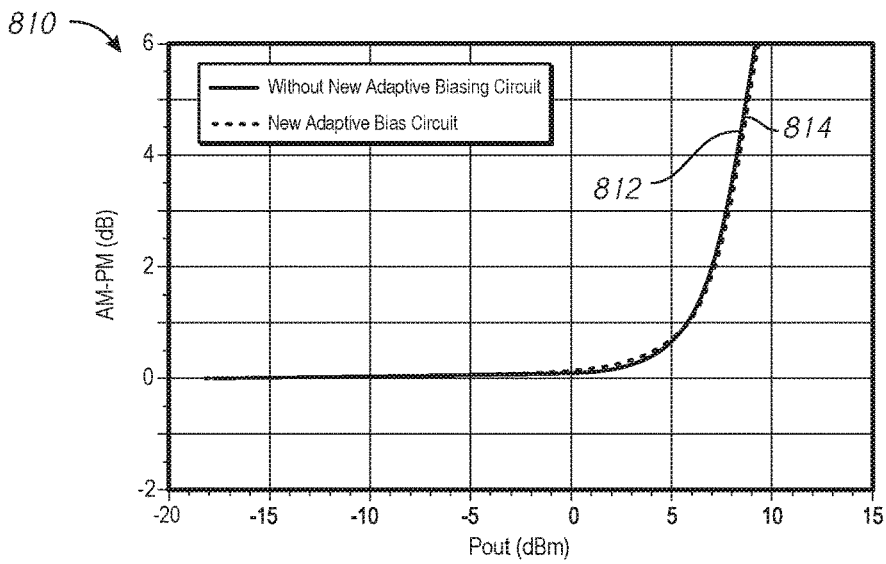
FIG. 8B is graph of AM-PM distortion versus output power, according to an embodiment.

FIG. 8B is graph 810 of AM-PM distortion versus output power. Trace 814 illustrates the AM-PM distortion versus output power of the simulated CMOS power amplifier with the adaptive bias circuit as illustrated in FIG. 6A. Trace 812 illustrates the AM-PM distortion versus output power of the simulated CMOS power amplifier without the adaptive bias circuit as illustrated in FIG. 6B.

As shown, the CMOS power amplifier with the adaptive bias circuit improves AM-AM distortion and AM-PM distortion. The AM-AM distortion of the power amplifier (FIG. 8A) is improved because the adaptive bias circuit causes the AM-AM distortion to becomes more flat and constant with output power, which results in improved communication system linearity, lower EVM (error vector magnitude), and OIP3. The AM-PM distortion versus output power of the power amplifier (FIG. 8B) is improved because the adaptive bias circuit causes the AM-PM distortion to become more flat and constant with output power, which improves the output power intercept point OIP3.

Figure 9:
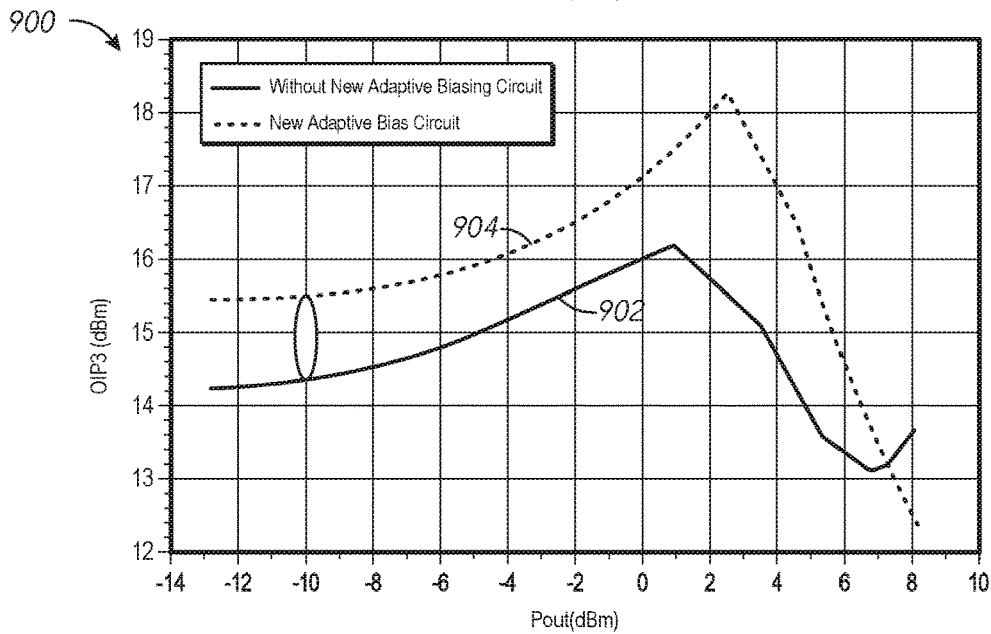
FIG. 9 is graph of output intercept point OIP3 versus output power, according to an embodiment.

FIG. 9 is graph 900 of output intercept point OIP3 versus output power. Trace 904 illustrates the output intercept point OIP3 versus output power of the simulated CMOS power amplifier with the adaptive bias circuit as illustrated in FIG. 6A. Trace 902 illustrates the output intercept point OIP3 versus output power of the simulated CMOS power amplifier without the adaptive bias circuit as illustrated in FIG. 6B. As shown, the effect of the shunt resistor arrangement and the floating gate linearizer arrangement improves the output intercept point OIP3. The OIP3 versus output power of the power amplifier is improved with the linearization circuit because of the improvement in AM-AM and AM-PM distortion across output power.

Test Results for Implementation of New Adaptive Bias Circuit

Figure 10:
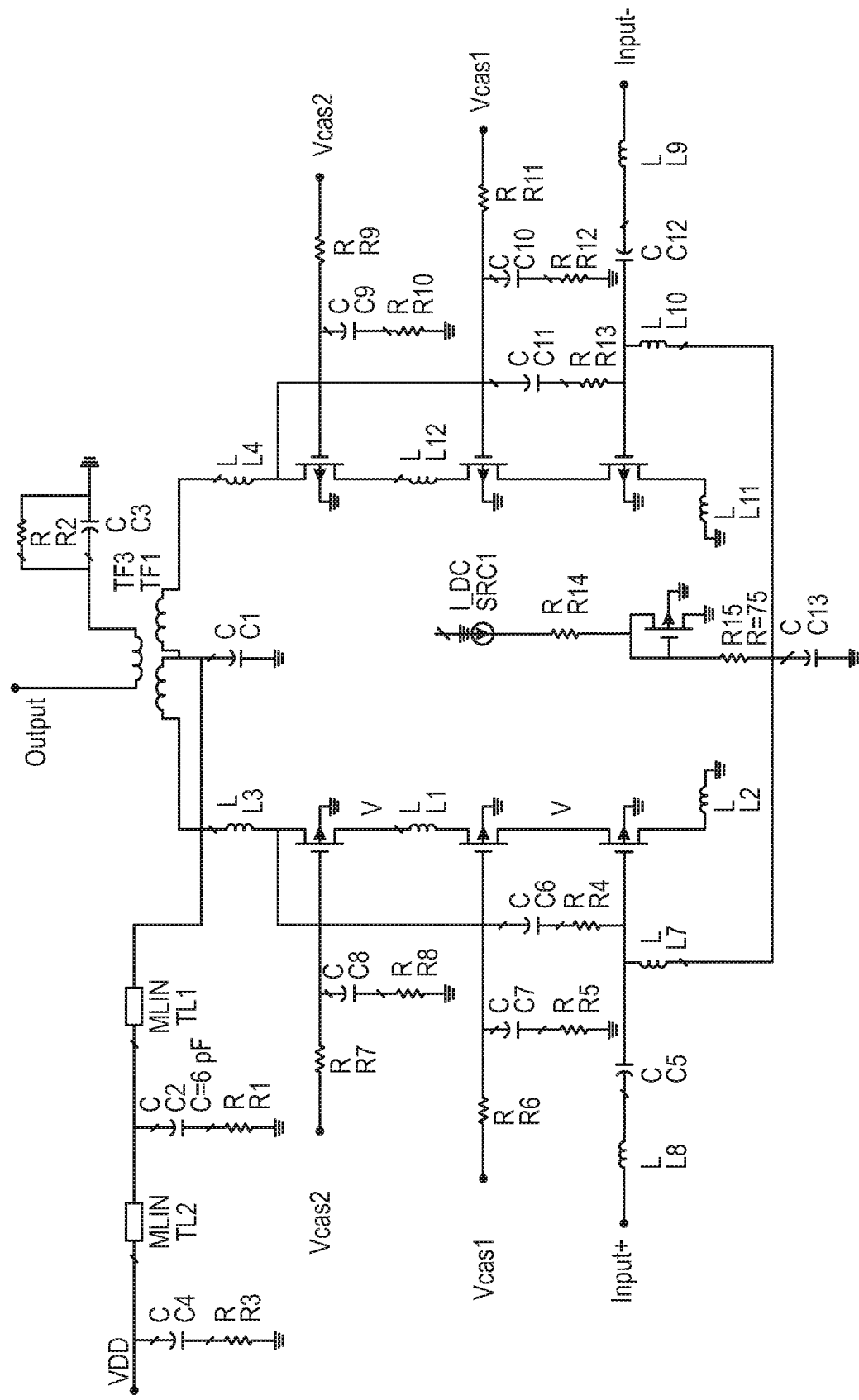
FIG. 10 is a detailed schematic diagram of a differential 3-stacked Class A CMOS power amplifier without the new adaptive biasing circuit (no linearization), according to an embodiment.
Figure 11:
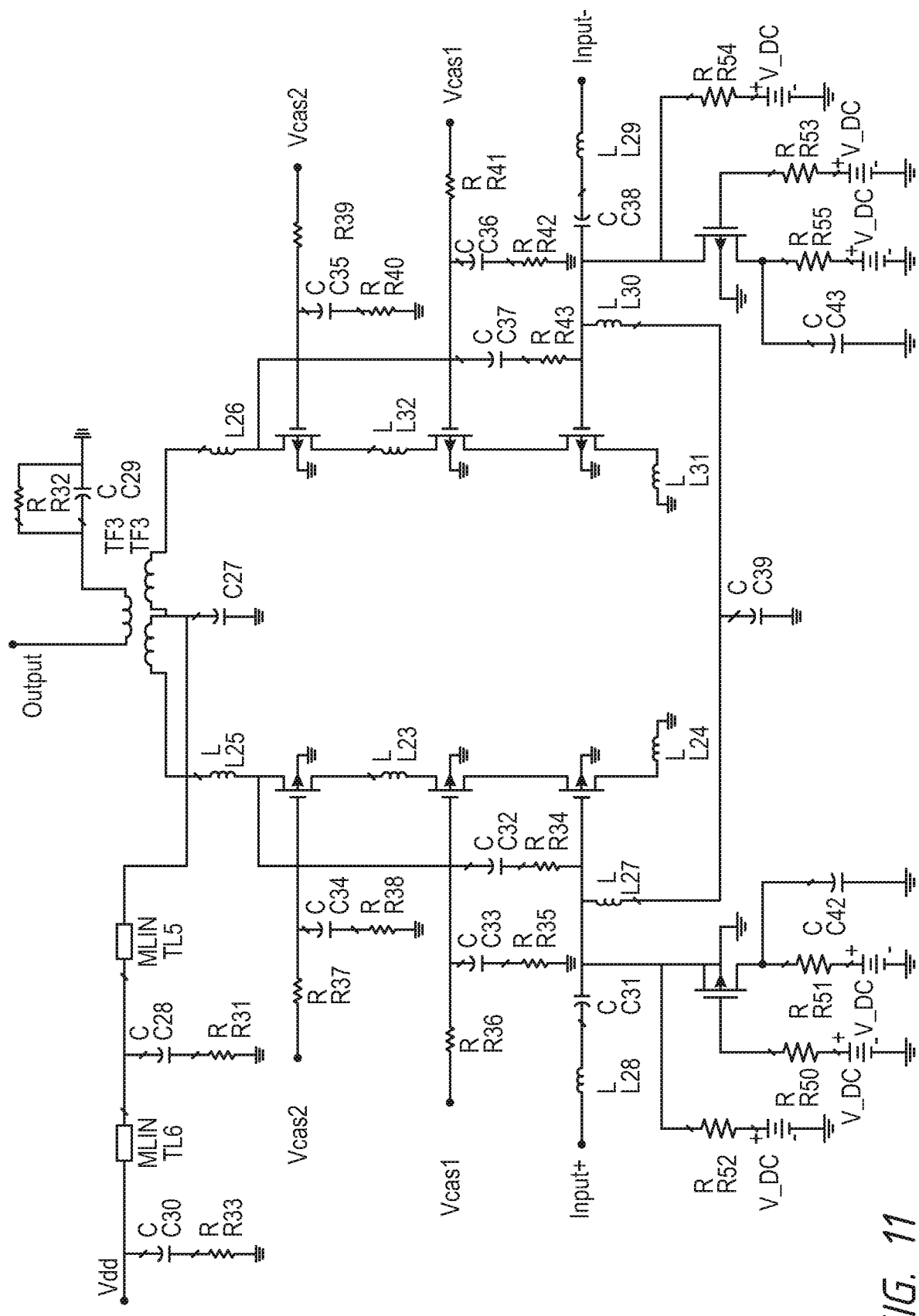
FIG. 11 is a detailed schematic diagram of a differential 3-stacked Class AB CMOS power amplifier with the new adaptive biasing circuit, according to an embodiment.

FIG. 10 is a detailed schematic diagram of a differential 3-stacked Class A CMOS power amplifier without the new adaptive biasing circuit (no linearization) according to some embodiments. FIG. 11 is a detailed schematic diagram of a differential 3-stacked Class AB CMOS power amplifier with the new adaptive biasing circuit according to some embodiments.

Measured values of the OP1 dB for the CMOS power amplifier without the new adaptive bias circuit as illustrated in FIG. 10 are 11 dBm minimum and 12.2 dBm typical. Measured values of the OP1 dB for the CMOS power amplifier with the new adaptive bias circuit as illustrated in FIG. 11 are 14 dBm minimum and 15 dBm typical.

Measured values of the power consumption (2 volt Vdd) for the CMOS power amplifier without the new adaptive bias circuit as illustrated in FIG. 10 are 98 mW typical. Measured values of the power consumption (2 volt Vdd) for the CMOS power amplifier with the new adaptive bias circuit as illustrated in FIG. 11 are 14 dBm minimum and 50 mW typical.

The measured value of the power amplifier efficiency at P1 dB at 28 GHz for the CMOS power amplifier without the new adaptive bias circuit as illustrated in FIG. 10 is 18%. Measured values of the power amplifier efficiency at P1 dB at 28 GHz for the CMOS power amplifier with the new adaptive bias circuit as illustrated in FIG. 11 are 14 dBm minimum and 27%.

Figure 12A:
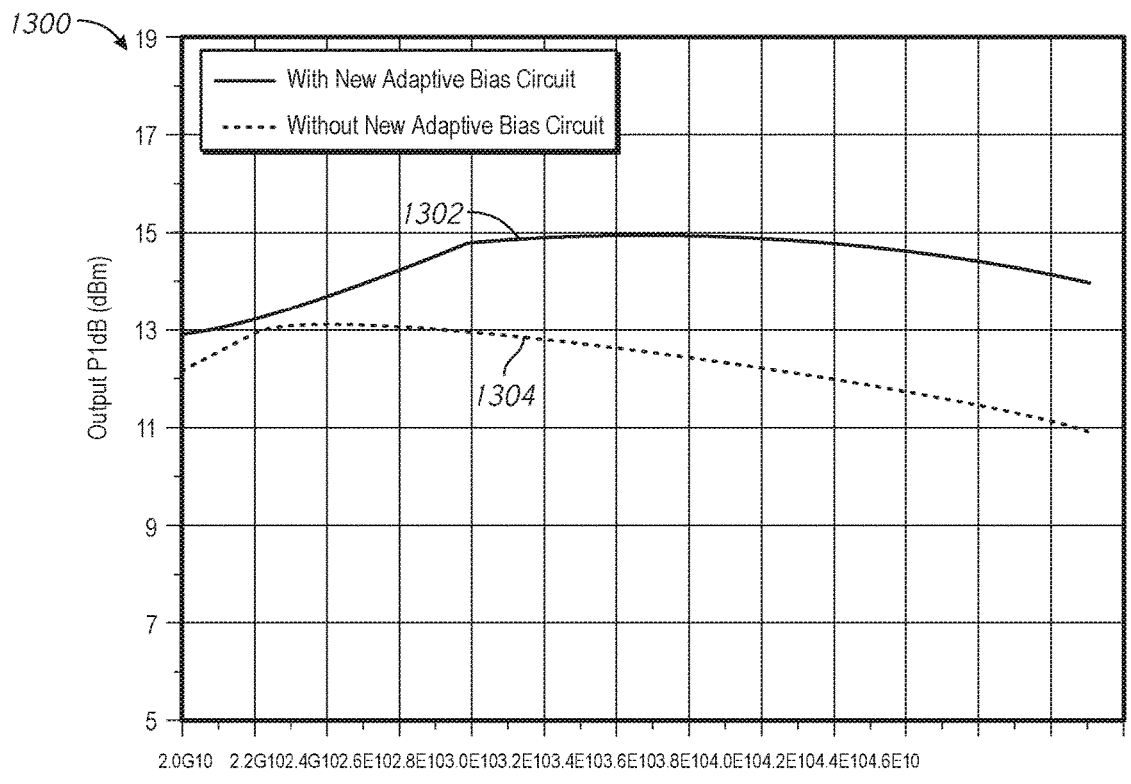
FIG. 12A is graph of the output P1 dB compression point versus RF frequencies, according to an embodiment.

FIG. 12A is graph 1300 of the output P1 dB compression point versus RF frequencies. Trace 1302 illustrates the output P1 dB compression point versus RF frequencies for the CMOS power amplifier with the new adaptive biasing circuit in FIG. 11. Trace 1304 illustrates the output P1 dB compression point versus RF frequencies for the CMOS power amplifier without the new adaptive biasing circuit in FIG. 10.

Figure 12B:
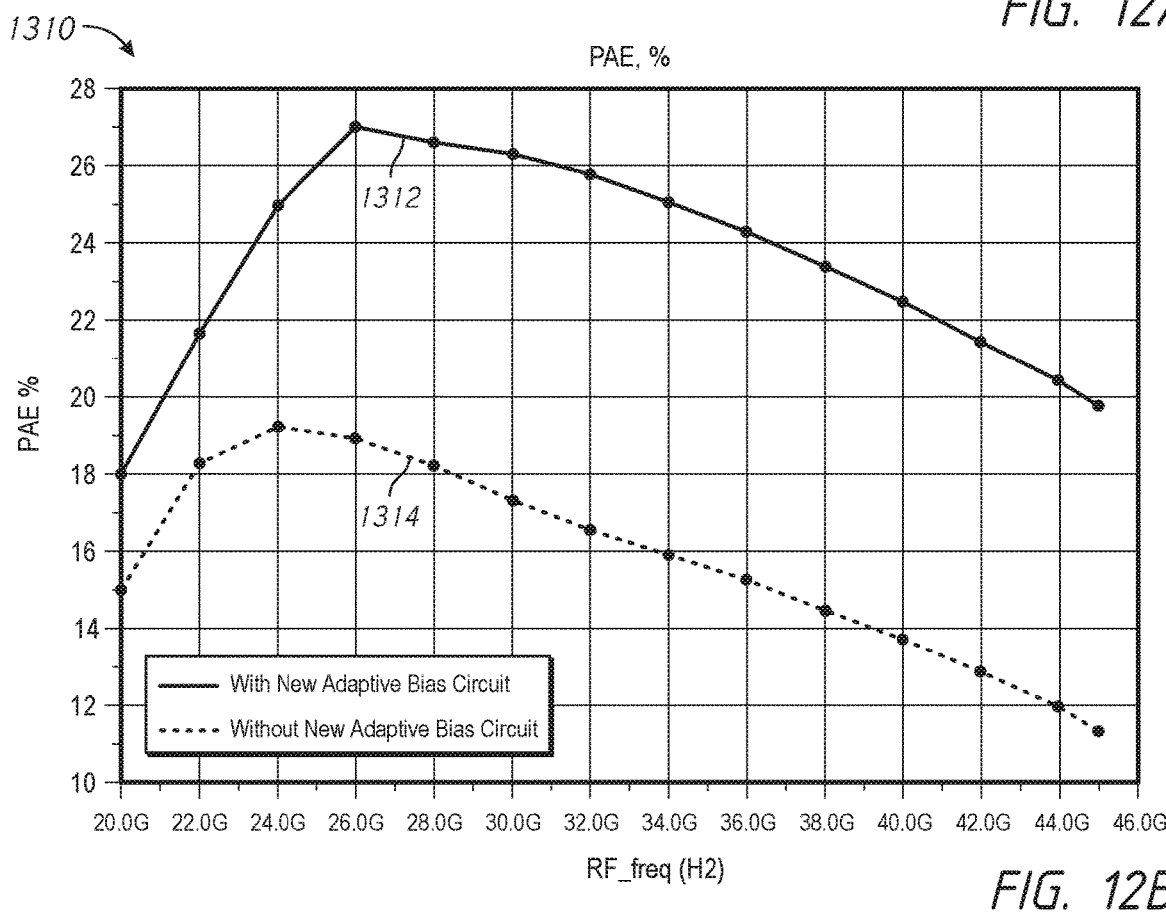
FIG. 12B is graph of the power amplifier efficiency versus output power, according to an embodiment.

FIG. 12B is graph 1310 of the power amplifier efficiency versus output power. Trace 1312 illustrates the power amplifier efficiency versus output power for the CMOS power amplifier with the new adaptive biasing circuit (FIG. 11). Trace 1314 illustrates the power amplifier efficiency versus output power for the CMOS power amplifier without the new adaptive biasing circuit (FIG. 10).

As shown in FIGS. 12A and 12B, the output P1 dB compression point and efficiency performance are improved with the new adaptive bias circuit. Such improvements are achieved over a wide frequency band. The output P1 dB in FIG. 12A improved by more than 2 dBm with the new adaptive bias circuit.

Figure 13:
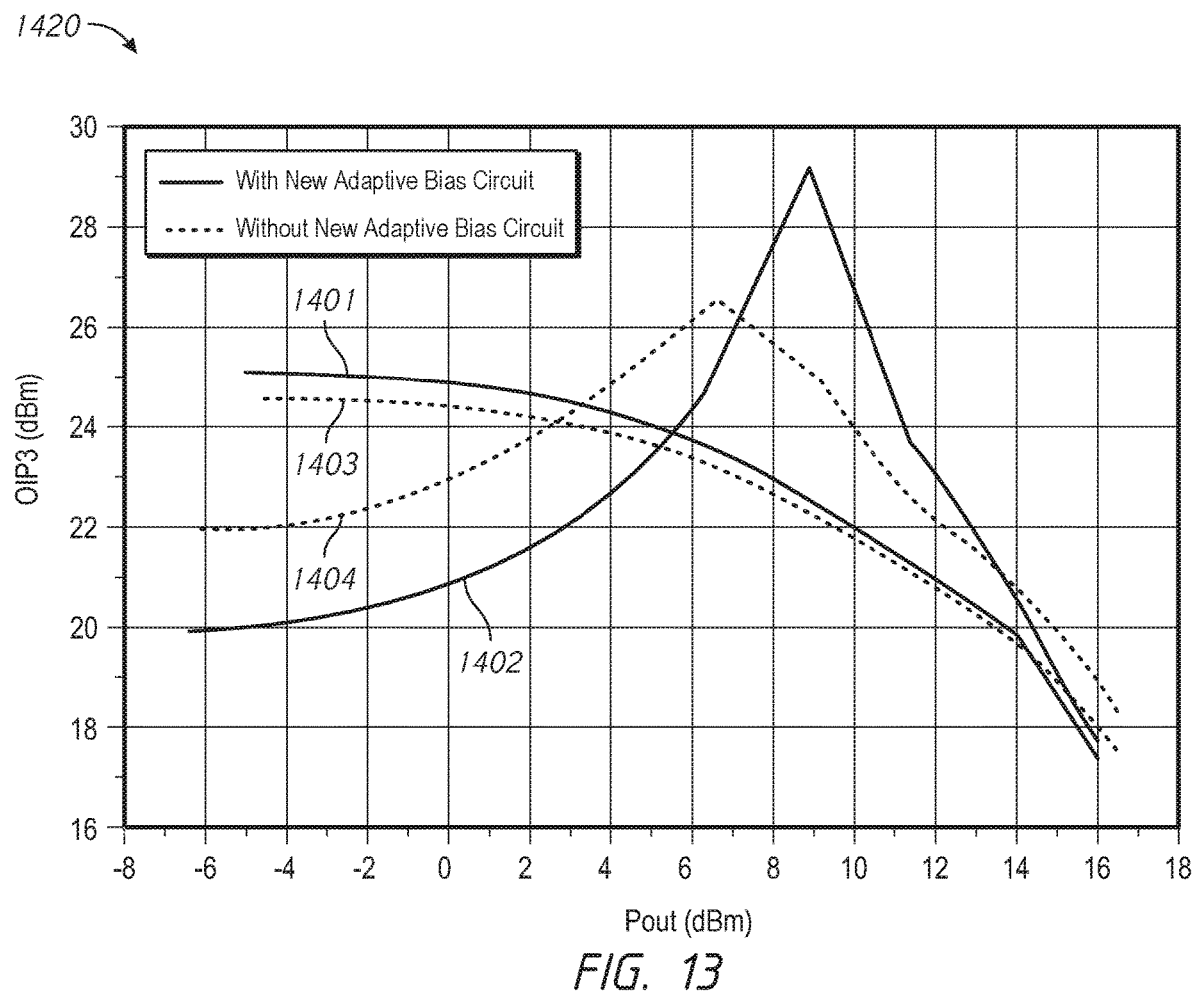
FIG. 13 is graph of the output intercept point OIP3 versus output power, according to an embodiment.

FIG. 13 is graph 1420 of the output intercept point OIP3 versus output power. Trace 1401 illustrates the power amplifier efficiency versus output power for the CMOS power amplifier with the new adaptive biasing circuit (FIG. 11) at 25 GHz. Trace 1403 illustrates the power amplifier efficiency versus output power for the CMOS power amplifier without the new adaptive biasing circuit (FIG. 10) at 25 GHz.

Trace 1402 illustrates the power amplifier efficiency versus output power for the CMOS power amplifier with the new adaptive biasing circuit (FIG. 11) at 28 GHz. Trace 1404 illustrates the power amplifier efficiency versus output power for the CMOS power amplifier without the new adaptive biasing circuit (FIG. 10) at 28 GHz. As illustrated, the new adaptive bias circuit improves IM3 components and OIP3 at higher output power.

Figure 14A:
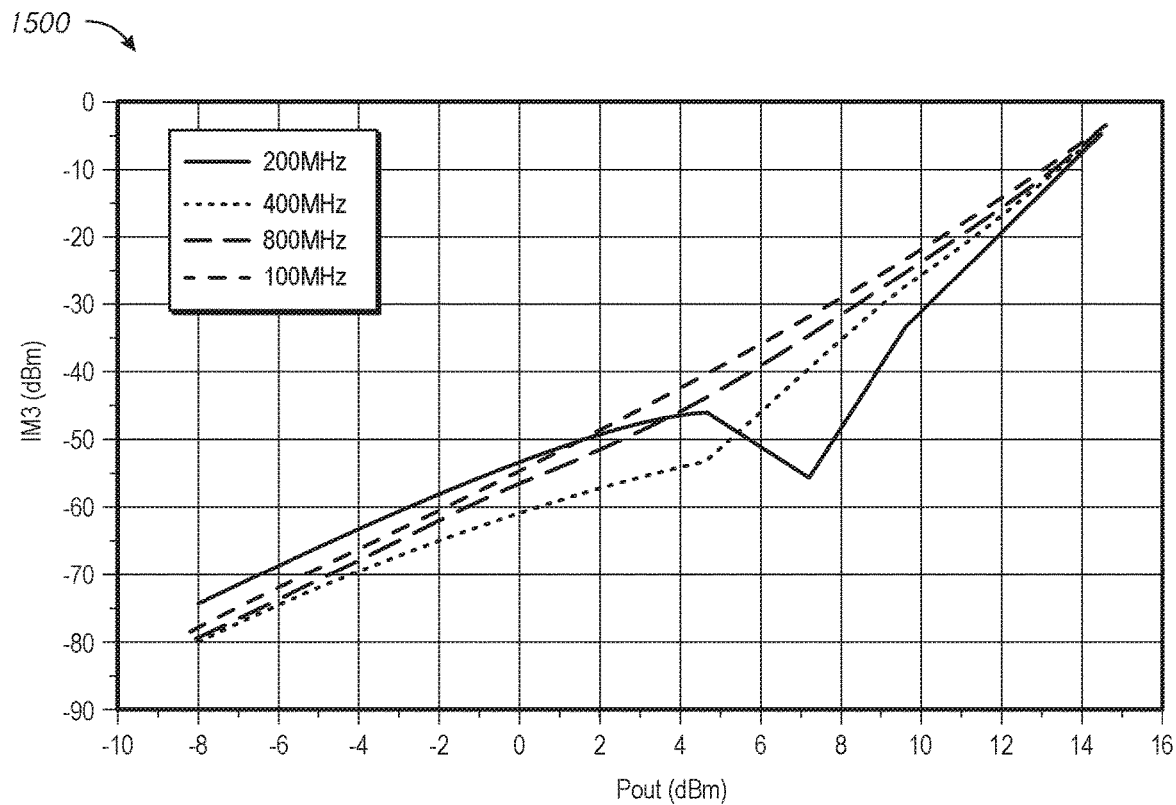
FIG. 14A is graph of the intermodulation distortion IM3 versus output power for different tone spacings using a two-tone signal, according to an embodiment.
Figure 14B:
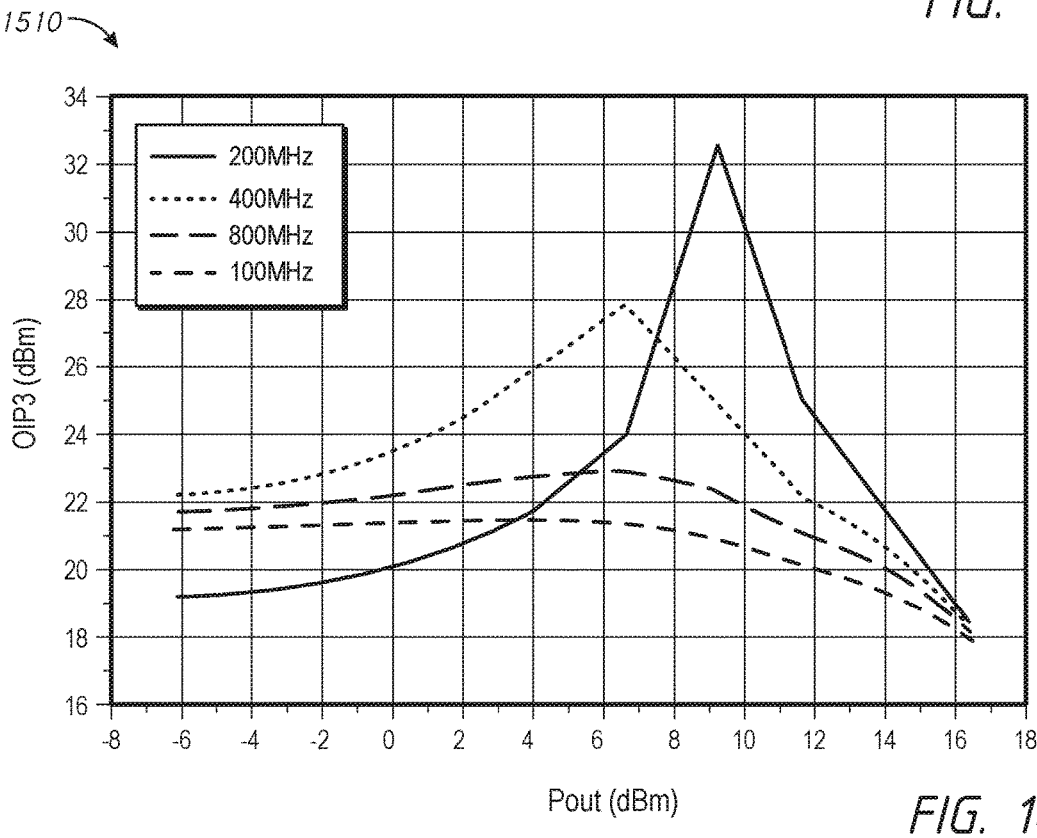
FIG. 14B is graph of the third intercept point OIP3 versus output power for different tone spacings using a two-tone signal according to an embodiment.

FIG. 14A is graph 1500 of the intermodulation distortion IM3 versus output power for different tone spacings using a two-tone signal for the CMOS power amplifier with the new adaptive bias circuit illustrated in FIG. 11. FIG. 14B is graph 1510 of the third intercept point OIP3 versus output power for different tone spacings using a two-tone signal for the CMOS power amplifier with new adaptive bias circuit illustrated in FIG. 11. As shown, the new adaptive bias circuit can support enhanced linearity across different tone spacings, and thus the new adaptive bias circuit enhances linearity and efficiency for a wideband signal.

Figure 15A:
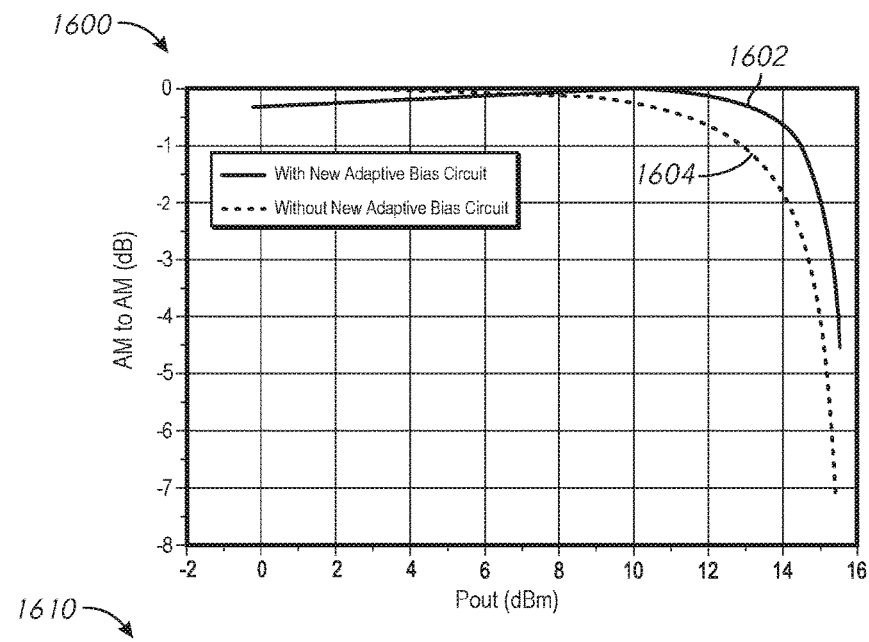
FIG. 15A is graph of the AM-to-AM distortion versus output power at approximately 28 GHz, according to an embodiment.

FIG. 15A is graph 1600 of the AM-to-AM distortion versus output power at approximately 28 GHz. Trace 1604 illustrates the AM-to-AM distortion versus output power for the CMOS power amplifier without the new adaptive biasing circuit illustrated in FIG. 10 and trace 1602 illustrates the AM-to-AM distortion versus output power for the CMOS power amplifier with the new adaptive bias circuit illustrated in FIG. 11.

Figure 15B:
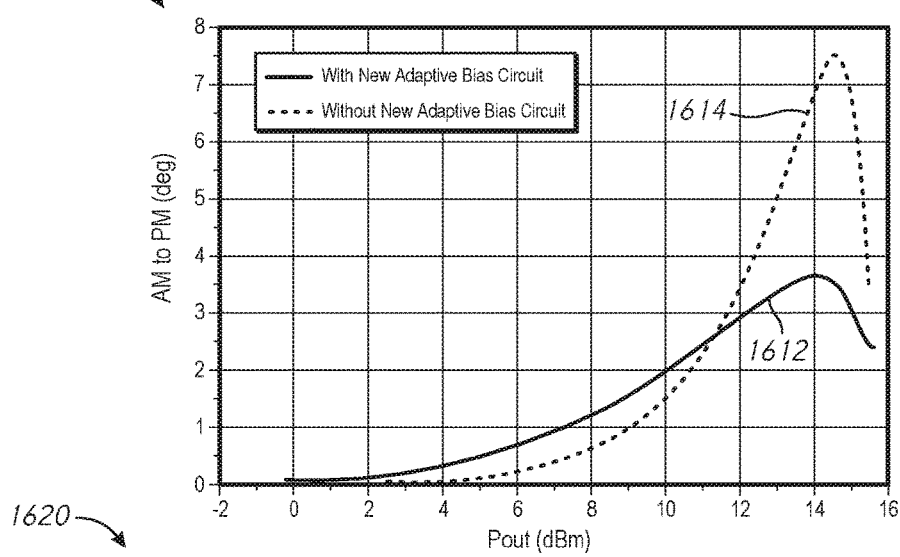
FIG. 15B is graph of the AM-to-PM distortion versus output power at approximately 28 GHz, according to an embodiment.

FIG. 15B is graph 1610 of the AM-to-PM distortion versus output power at approximately 28 GHz. Trace 1614 illustrates the AM-to-PM distortion versus output power for the CMOS power amplifier without the new adaptive biasing circuit illustrated in FIG. 10 and trace 1612 illustrates the AM-to-PM distortion versus output power for the CMOS power amplifier with the new adaptive bias circuit illustrated in FIG. 11.

Figure 15C:
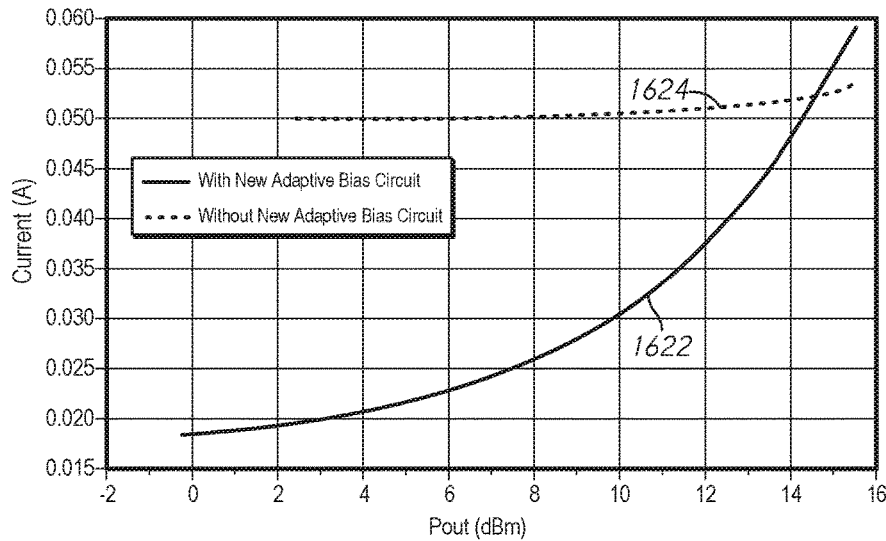
FIG. 15C is graph of the current versus output power at approximately 28 GHz, according to an embodiment.

FIG. 15C is graph 1620 of the current versus output power at approximately 28 GHz. Trace 1624 illustrates the current versus output power for the CMOS power amplifier without the new adaptive biasing circuit illustrated in FIG. 10 and trace 1622 illustrates the current versus output power for the CMOS power amplifier with the new adaptive bias circuit illustrated in FIG. 11.

Figure 16A:
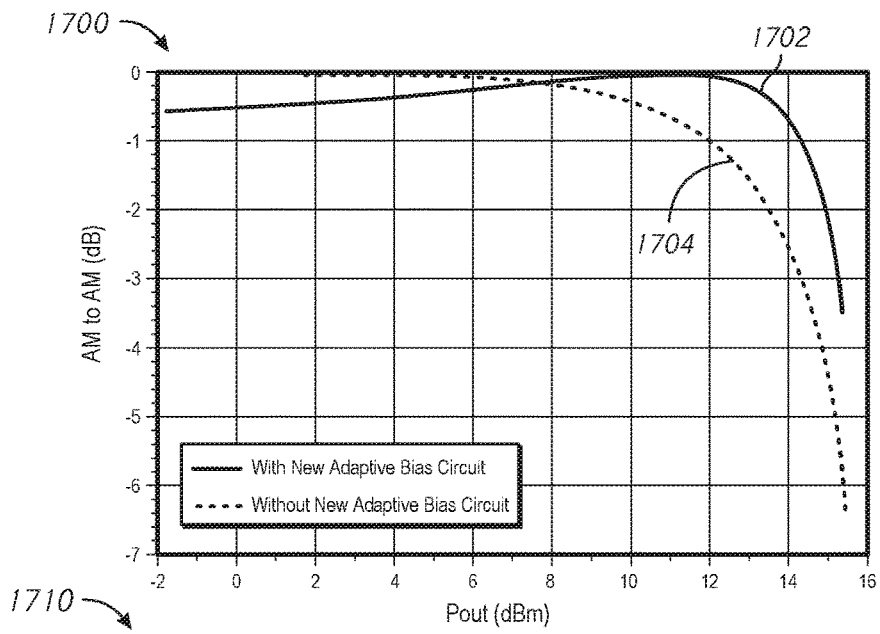
FIG. 16A is graph of the AM-to-AM distortion versus output power at approximately 38 GHz, according to an embodiment.

FIG. 16A is graph 1700 of the AM-to-AM distortion versus output power at approximately 38 GHz. Trace 1704 illustrates the AM-to-AM distortion versus output power without for the CMOS power amplifier without the new adaptive biasing circuit illustrated in FIG. 10 and trace 1702 illustrates the AM-to-AM distortion versus output power for the CMOS power amplifier with the new adaptive bias circuit illustrated in FIG. 11.

Figure 16B:
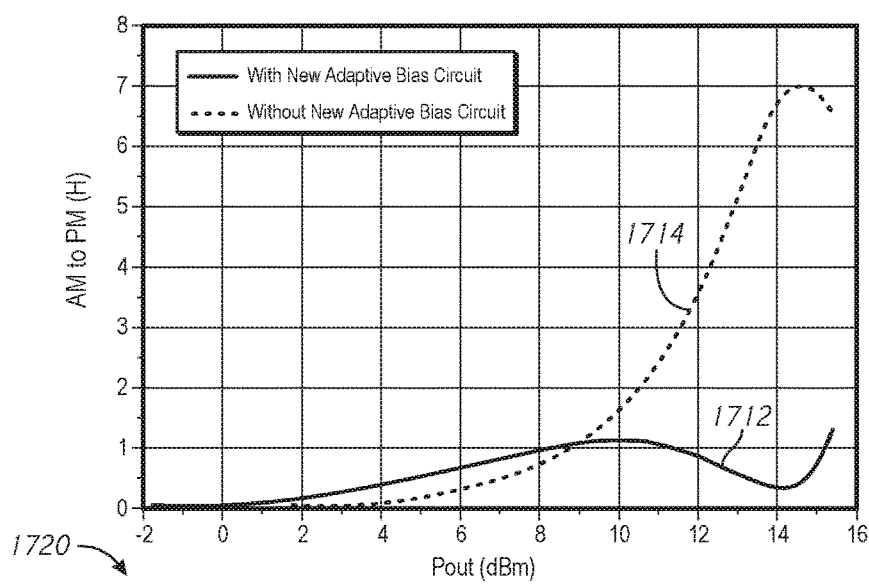
FIG. 16B is graph of the AM-to-PM distortion versus output power at approximately 38 GHz, according to an embodiment.

FIG. 16B is graph 1710 of the AM-to-PM distortion versus output power at approximately 38 GHz. Trace 1714 illustrates the AM-to-AM distortion versus output power for the CMOS power amplifier without the new adaptive biasing circuit illustrated in FIG. 10 and trace 1712 illustrates the AM-to-AM distortion versus output power for the CMOS power amplifier with the new adaptive bias circuit illustrated in FIG. 11.

Figure 16C:
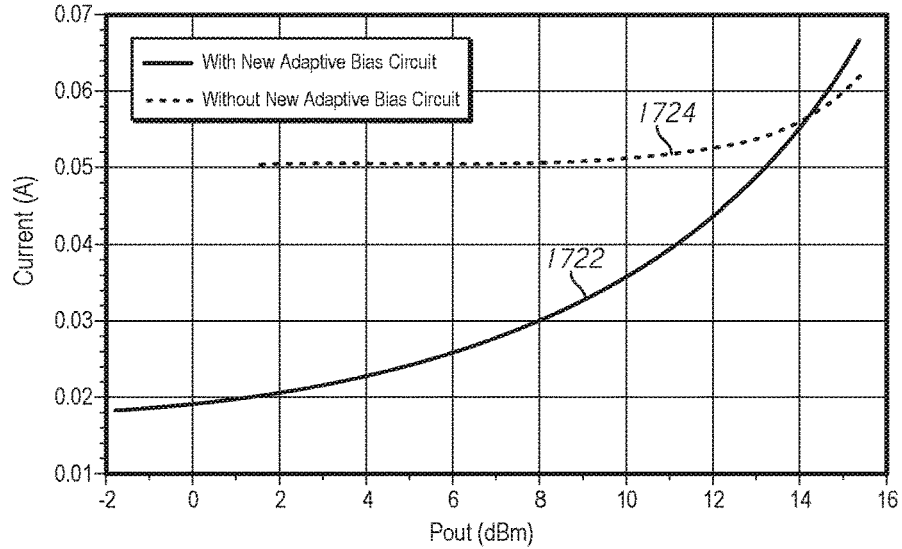
FIG. 16C is graph of the current versus output power at approximately 38 GHz, according to an embodiment.

FIG. 16C is graph 1720 of the current versus output power at approximately 38 GHz. Trace 1724 illustrates the current versus output power for the CMOS power amplifier without the new adaptive biasing circuit illustrated in FIG. 10 and trace 1722 illustrates the current versus output power for the CMOS power amplifier with the new adaptive bias circuit illustrated in FIG. 11.

The graphs 1600, 1610, 1700, 1710 of FIGS. 15A, 15B, 16A, and 16B illustrate improved performance in distortion for the new adaptive circuit. The graphs 1620, 1720 of FIGS. 15C and 16C illustrate the reduced current required for voltage output using the new adaptive circuit.

Figure 17:
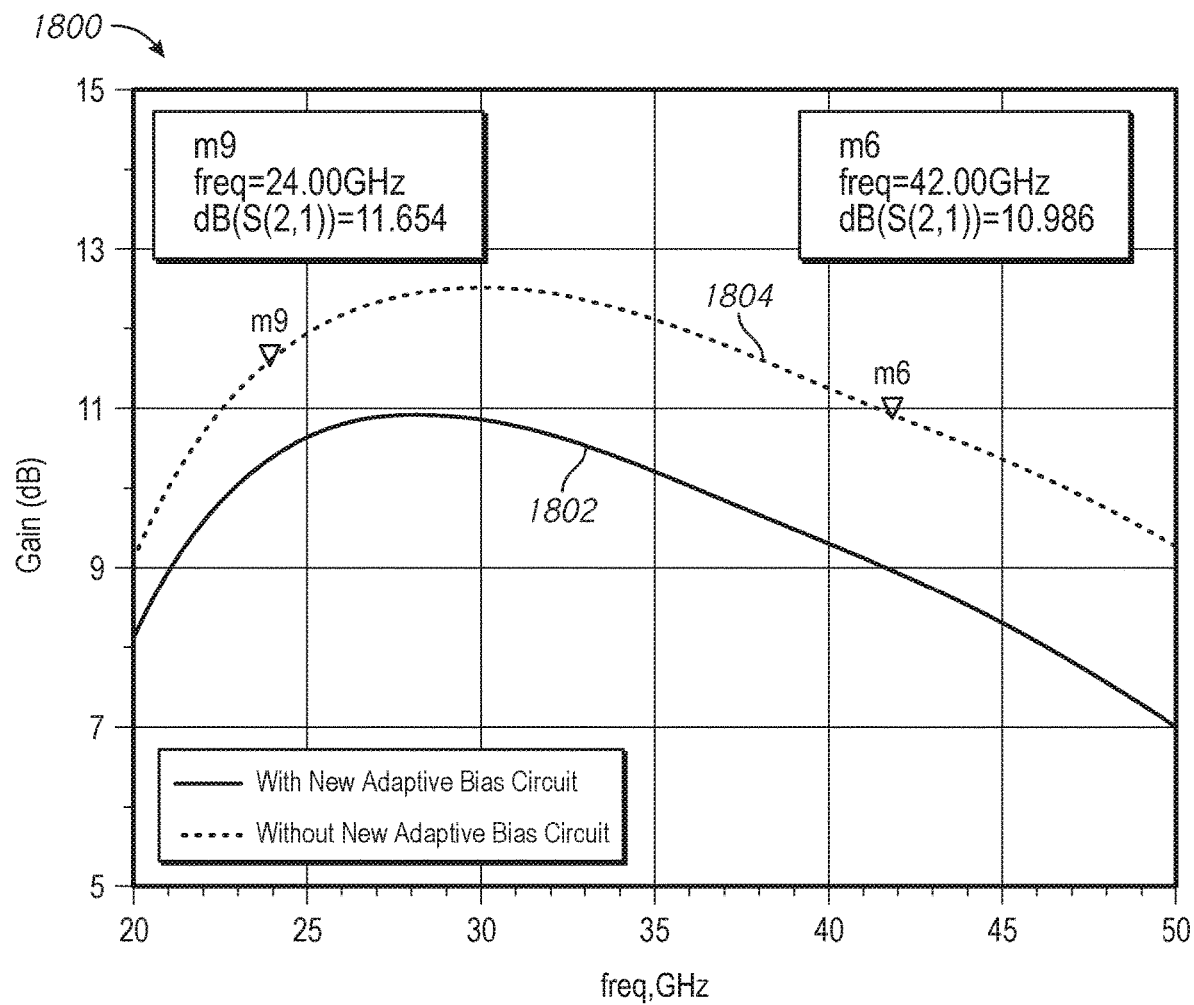
FIG. 17 is graph of the S21 parameter (forward voltage gain) versus frequency, according to an embodiment.

FIG. 17 is graph 1800 of the S21 parameter (forward voltage gain) versus frequency. Trace 1804 illustrates the S21 parameter (forward voltage gain) versus frequency for the CMOS power amplifier without the new adaptive biasing circuit illustrated in FIG. 10 and trace 1802 illustrates the S21 parameter (forward voltage gain) versus frequency for the CMOS power amplifier with the new adaptive bias circuit illustrated in FIG. 11.

Applications

Any of the principles and advantages discussed herein can be applied to other systems, not just to the systems described above. The elements and operations of the various embodiments described above can be combined to provide further embodiments. Some of the embodiments described above have provided examples in connection with transceiver integrated circuits. However, the principles and advantages of the embodiments can be used in connection with any other systems, apparatus, or methods that could benefit from any of the teachings herein.

Aspects of this disclosure can be implemented in various electronic devices. Examples of the electronic devices can include, but are not limited to, consumer electronic products, parts of the consumer electronic products such as semiconductor die and/or packaged modules, electronic test equipment, wireless communication devices, personal area network communication devices, cellular communications infrastructure such as a base station, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

CONCLUSION

Unless the context requires otherwise, throughout the description and the claims, the words "comprise," "comprising," "include," "including," and the like are to generally be construed in an inclusive sense, as opposed to an exclusive or exhaustive sense; that is to say, in the sense of "including, but not limited to." The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural may also include the plural or singular, respectively. The word "or" in reference to a list of two or more items, is generally intended to encompass all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding whether these features, elements and/or states are included or are to be performed in any particular embodiment.

While certain embodiments have been described, these embodiments have been presented by way of example only, and are not intended to limit the scope of the disclosure. Indeed, the novel methods, apparatus, and systems described herein may be embodied in a variety of other forms; furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A bias circuit for a power amplifier to enhance linearization of bias ramping for the power amplifier, the bias circuit comprising:
   a field-effect transistor (FET);
   a linearizer arrangement configured to float a gate terminal of the FET to generate a bias signal with quadratic ramping; and
   a resistor arrangement electrically connected in parallel with the linearizer arrangement, the resistor arrangement configured to add a linear term to the bias signal, wherein the linearizer arrangement and the resistor arrangement are configured to provide the bias signal at an input of the power amplifier,
   wherein the linearizer arrangement is a floating gate linearizer arrangement that comprises the FET, wherein the FET includes a first terminal, a second terminal, and the gate terminal, wherein the gate terminal is electrically connected to a first end of a first resistor, and wherein the first terminal of the FET is electrically connected to a first node.

2. The bias circuit of claim 1, wherein the resistor arrangement is a shunt resistor arrangement that comprises a second resistor, wherein a first end of the second resistor is electrically connected to the first node, the first node is electrically connected to the input of the power amplifier.

3. The bias circuit of claim 2, wherein a second end of the second resistor is electrically connected to a first voltage source.

4. The bias circuit of claim 1, wherein the first node is further electrically connected to an alternating power source.

5. The bias circuit of claim 4, wherein the bias circuit increases a magnitude of the bias signal for the power amplifier during a negative half cycle of the alternating power source and wherein the bias circuit increases or approximately maintains the magnitude of the bias signal for the power amplifier during a positive half cycle of the alternating power source.

6. The bias circuit of claim 1, wherein a second node is electrically connected to the second terminal of the FET, a first end of a capacitor, and a first end of a second resistor.

7. The bias circuit of claim 6, wherein a second end of the second resistor is electrically connected to a first voltage source, a second voltage source is electrically connected to the second end of the first resistor, and a third voltage source is electrically connected to a second end of a third resistor, and wherein the first voltage source, the second voltage source, and the third voltage source are different.

8. The bias circuit of claim 7, wherein values of the first voltage source, the second voltage source, and the third voltage source are based on a selected class of power amplifiers.

9. The bias circuit of claim 8, wherein a value of at least one of the first resistor, the second resistor, the third resistor, the capacitor, or the FET is based on the selected class of power amplifiers.

10. The bias circuit of claim 6, wherein a second end of the second resistor is electrically connected to a first voltage source, a second voltage source is electrically connected to the second end of the first resistor, and a third voltage source is electrically connected to a second end of a third resistor, and wherein at least two of the first voltage source, the second voltage source, and the third voltage source are connected.

11. The bias circuit of claim 6, wherein a second end of the capacitor is electrically connected to ground.

12. The bias circuit of claim 1, wherein the power amplifier is a CMOS power amplifier.

13. A bias circuit for a power amplifier to control bias ramping for a power amplifier, wherein the bias circuit comprises a linearizer arrangement electrically connected to an input of the power amplifier in parallel with a Metal-Oxide-Semiconductor Field-Effect Transistor (MOSFET), the linearizer arrangement configured to enhance linearity of bias ramping for the power amplifier wherein the linearizer arrangement is a floating gate linearizer that comprises a first Field-Effect Transistor (FET), wherein the first FET includes a first terminal, a second terminal, and a gate terminal, wherein the gate terminal is electrically connected to a first end of a first resistor, and wherein a first node is electrically connected to an input of the power amplifier, the first terminal of the first FET, and an alternating power source.

14. The bias circuit of claim 13, wherein during a negative half cycle of the alternating power source, a current propagates from the second terminal to the first terminal of the first FET, and during a positive half cycle of the alternating power source, the current propagates from the first terminal to the second terminal of the first FET.

15. The bias circuit of claim 13, wherein the linearizer arrangement further comprises a second FET connected in parallel to the first FET.

16. The bias circuit of claim 13, wherein the bias circuit decreases a magnitude of the input for the power amplifier during a negative half cycle of the alternating power source and wherein the bias circuit increases a magnitude of the input for the power amplifier during a positive half cycle of the alternating power source.

17. A bias circuit for a power amplifier, the bias circuit comprising a resistor arrangement configured to enhance linearity of bias ramping for the power amplifier, wherein enhancing linearity of bias ramping by the resistor arrangement comprises tracking input power of the power amplifier, wherein the resistor arrangement is a shunt resistor arrangement that comprises a first resistor, wherein a first end of the first resistor is electrically connected to a first node, the first node is electrically connected to the input of the power amplifier, wherein a second end of the first resistor is electrically connected to a first voltage source.

18. The bias circuit of claim 1, wherein floating the gate terminal by the linearizer arrangement comprises generating an Alternating Current (AC) floating gate terminal.

19. The bias circuit of claim 17, wherein the power amplifier is a Complementary Metal Oxide Semiconductor (CMOS) power amplifier.

20. The bias circuit of claim 17, wherein the bias circuit increases a magnitude of a bias signal for the power amplifier during a negative half cycle of an alternating power source and wherein the bias circuit increases or approximately maintains the magnitude of the bias signal for the power amplifier during a positive half cycle of the alternating power source.

21. The bias circuit of claim 17, wherein the bias circuit further comprises a linearizer arrangement electrically connected to the input of the power amplifier in parallel with a MOSFET.

22. The bias circuit of claim 21, wherein the linearizer arrangement comprises a first FET connected in parallel to a second FET.

* * * * *

UNITED STATES PATENT AND TRADEMARK OFFICE
CERTIFICATE OF CORRECTION

PATENT NO. : 10,680,564 B2
APPLICATION NO. : 16/042782
DATED : June 9, 2020
INVENTOR(S) : Mohamed Moussa Ramadan Esmael It is certified that error appears in the above-identified patent and that said Letters Patent is hereby corrected as shown below:

In the Specification

In Column 4, Line 14, delete "P1 dB" and insert --P1dB--.

In Column 8, Line 63, delete "$C_{gs}-C_{gd}$" and insert --$C_{gs}$ ~$C_{gd}$--.

In Column 11, Line 30, delete "OP1 dB" and insert --OP1dB--.

In Column 11, Line 33, delete "OP1 dB" and insert --OP1dB--.

In Column 11, Line 44, delete "P1 dB" and insert --P1dB--.

In Column 11, Line 46, delete "P1 dB" and insert --P1dB--.

In Column 11, Line 50, delete "P1 dB" and insert --P1dB--.

In Column 11, Line 52, delete "P1 dB" and insert --P1dB--.

In Column 11, Line 54, delete "P1 dB" and insert --P1dB--.

In Column 11, Line 65, delete "P1 dB" and insert --P1dB--.

In Column 12, Line 1, delete "P1 dB" and insert --P1dB--.

In Column 12, Line 2, delete "2 dBm" and insert --2dBm--.

In the Claims

In Column 15, Line 51, Claim 13, delete "amplifier" and insert --amplifier,--.

Signed and Sealed this
Twenty-seventh Day of October, 2020

Andrei Iancu
*Director of the United States Patent and Trademark Office*